United States Patent
Kaji et al.

(10) Patent No.: US 10,208,206 B2
(45) Date of Patent: Feb. 19, 2019

(54) CURABLE RESIN COMPOSITION AND CURED PRODUCT THEREOF, SEALING MATERIAL FOR OPTICAL SEMICONDUCTOR, DIE BONDING MATERIAL, AND OPTICAL SEMICONDUCTOR LIGHT-EMITTING ELEMENT

(71) Applicant: Asahi Kasei Chemicals Corporation, Tokyo (JP)

(72) Inventors: Satoru Kaji, Tokyo (JP); Ryoko Watanabe, Tokyo (JP); Tamotsu Kodama, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 365 days.

(21) Appl. No.: 14/889,545

(22) PCT Filed: May 1, 2014

(86) PCT No.: PCT/JP2014/062092
§ 371 (c)(1),
(2) Date: Nov. 6, 2015

(87) PCT Pub. No.: WO2014/181754
PCT Pub. Date: Nov. 13, 2014

(65) Prior Publication Data
US 2016/0115318 A1    Apr. 28, 2016

(30) Foreign Application Priority Data

May 8, 2013 (JP) .................. 2013-098694

(51) Int. Cl.
| | | |
|---|---|---|
| H01L 23/29 | (2006.01) | |
| H01L 23/14 | (2006.01) | |
| C09J 183/06 | (2006.01) | |
| C08L 83/06 | (2006.01) | |
| C08G 59/32 | (2006.01) | |
| C08K 5/37 | (2006.01) | |
| C08K 5/13 | (2006.01) | |
| C08K 5/54 | (2006.01) | |
| C08K 5/5419 | (2006.01) | |
| H01L 33/56 | (2010.01) | |
| C08G 77/14 | (2006.01) | |

(52) U.S. Cl.
CPC .............. *C08L 83/06* (2013.01); *C08G 59/32* (2013.01); *C08G 59/3281* (2013.01); *C08K 5/13* (2013.01); *C08K 5/37* (2013.01); *C08K 5/5403* (2013.01); *C08K 5/5419* (2013.01); *C08G 77/14* (2013.01); *H01L 33/56* (2013.01); *H01L 2224/45144* (2013.01); *H01L 2224/48091* (2013.01)

(58) Field of Classification Search
None
See application file for complete search history.

(56) References Cited

U.S. PATENT DOCUMENTS

| | | | | |
|---|---|---|---|---|
| 5,391,678 A * | 2/1995 | Bard | ...................... | C08G 77/50 528/25 |
| 5,585,445 A | 12/1996 | Meguriya et al. | | |
| 5,618,631 A | 4/1997 | Meguriya et al. | | |
| 5,714,265 A | 2/1998 | Meguriya et al. | | |
| 7,932,319 B2 * | 4/2011 | Yamamoto | ........... | C08G 59/306 524/588 |
| 8,222,348 B2 * | 7/2012 | Kuroda | ................ | C08G 59/306 524/588 |
| 9,297,950 B2 * | 3/2016 | Sohma | .................. | C03C 25/106 |
| 2009/0258992 A1 | 10/2009 | Yamamoto et al. | | |
| 2010/0120975 A1 | 5/2010 | Kuroda et al. | | |
| 2011/0058776 A1 | 3/2011 | Taniguchi et al. | | |
| 2012/0193817 A1 | 8/2012 | Kanamani et al. | | |
| 2014/0199040 A1 * | 7/2014 | Sohma | .................. | C03C 25/106 385/128 |

FOREIGN PATENT DOCUMENTS

| | | | | |
|---|---|---|---|---|
| CN | 101291973 A | 10/2008 | | |
| CN | 101657490 A | 2/2010 | | |
| CN | 102010571 A | 4/2011 | | |
| JP | S61-019626 A | 1/1986 | | |
| JP | H07-308993 A | 11/1995 | | |
| JP | H08-053603 A | 2/1996 | | |
| JP | H08-224833 A | 9/1996 | | |
| JP | 11-005826 A * | 1/1999 | ............ | C08G 59/32 |
| JP | 3523098 B2 | 4/2004 | | |
| JP | 2007-246602 A | 9/2007 | | |
| JP | 2007-302825 A | 11/2007 | | |
| JP | 2009-270027 A | 11/2009 | | |
| JP | 2010-053203 A | 3/2010 | | |
| JP | 2010-083955 A | 4/2010 | | |
| JP | 2011-074355 A | 4/2011 | | |
| JP | 2012-041381 A | 3/2012 | | |
| JP | 2012-158631 A | 8/2012 | | |

(Continued)

OTHER PUBLICATIONS

Machine translation of JP 11-005826 A (no date).*
International Preliminary Report on Patentability and Written Opinion issued in counterpart International Patent Application No. PCT/JP2014/062092 dated Nov. 19, 2015.
International Search Report issued in counterpart International Patent Application No. PCT/JP2014/062092 dated Aug. 5, 2014.

*Primary Examiner* — Michael J Feely

(74) *Attorney, Agent, or Firm* — Morgan, Lewis & Bockius LLP

(57) ABSTRACT

The present invention relates to a curable resin composition comprising (A) an epoxy compound having three or more epoxy groups in one molecule and (B) an active hydrogen compound.

14 Claims, 7 Drawing Sheets

(56) References Cited

FOREIGN PATENT DOCUMENTS

| | | |
|---|---|---|
| JP | 2012-236893 A | 12/2012 |
| JP | 2012-236894 A | 12/2012 |
| WO | 2007/046399 A1 | 4/2007 |
| WO | 2008/133108 A1 | 11/2008 |
| WO | WO 2012/153821 A1 * 11/2012 | ............. C03C 25/24 |

* cited by examiner

| | manufactured by ENOMOTO CO., LTD. OP-5 | manufactured by TTOP CORP. 505010-8R(2L) |
|---|---|---|
| Example B1 |  Cured well and cracked |  Cured without problem |
| Example B2 |  Cured well and peeled |  Cured without problem |
| Comparative Example B1 |  Not cured and volatilized |  Not cured and volatilized |
| Comparative Example B2 |  Not cured |  Not cured |

CURABLE RESIN COMPOSITION AND CURED PRODUCT THEREOF, SEALING MATERIAL FOR OPTICAL SEMICONDUCTOR, DIE BONDING MATERIAL, AND OPTICAL SEMICONDUCTOR LIGHT-EMITTING ELEMENT

TECHNICAL FIELD

The present invention relates to a curable resin composition and a cured product thereof, a sealing material for an optical semiconductor, a die bonding material for an optical semiconductor, and an optical semiconductor light-emitting element. More specifically, the present invention relates to a curable resin composition that can provide a cured product having good hardness and resistance to yellowing by heat, a sealing material for an optical semiconductor and die bonding material using the cured product, and an optical semiconductor light-emitting element using the sealing material or the die bonding material.

BACKGROUND ART

It is known that due to the transparency, cured products obtained by curing epoxy resin compositions containing acid anhydride-based curing agents are suitably used as sealing materials for optical semiconductor elements such as light emission diodes and photodiodes.

As transparent cured products, typically cured products cured by hydrosilylation of siloxane containing an alkenyl group and siloxane containing an Si—H group (for example, see PTL 1) or the like are known.

However, as the performance of optical semiconductors has recently progressed, higher performance has been required for the resins for sealing the optical semiconductors, and cured products having excellent hardness and excellent resistance to yellowing by heat in which no discoloring or the like occurs even if a treatment at high temperature is performed.

CITATION LIST

Patent Literature

Patent Literature 1: Japanese Patent No. 3523098

SUMMARY OF INVENTION

Technical Problem

The cured products cured by hydrosilylation of siloxane containing an alkenyl group and siloxane containing an Si—H group have disadvantages in that the hardness of the cured products is low to readily cause stickiness on the surfaces thereof and the strength is low. Furthermore, if a substituent such as a phenyl group is introduced to enhance the strength, this has caused problems such as a reduction in weatherability and resistance to yellowing by heat.

An object of the present invention is to provide a cured product having excellent hardness and excellent resistance to yellowing by heat, and provide a curable resin composition suitably used for an optical semiconductor and a cured product thereof, a sealing material for an optical semiconductor and a die bonding material comprising the cured product, and an optical semiconductor light-emitting element using the sealing agent or the die bonding material.

Solution to Problem

The present inventors have found that the above problems can be solved by a curable resin composition containing a polyfunctional epoxy compound and an active hydrogen compound, and have completed the present invention.

Namely, the present invention is [1] to [17] below.

[1]: A curable resin composition, comprising (A) an epoxy compound having three or more epoxy groups in one molecule and (B) an active hydrogen compound.

[2]: The curable resin composition according to [1], wherein (A) the above epoxy compound having three or more epoxy groups in one molecule contains an organopolysiloxane containing a compound represented by the following formula (1) or a compound represented by the following formula (2):

[Chemical Formula 1]

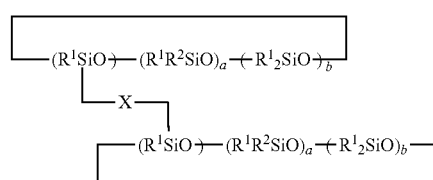

(1)

[Chemical Formula 2]

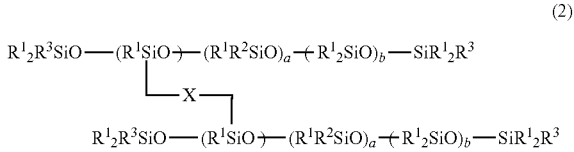

(2)

[where $R^1$ each independently represents a substituted or unsubstituted monovalent hydrocarbon group having a carbon number of 1 to 10; $R^2$ each independently represents an epoxy group-containing organic group; $R^3$ each independently represents $R^1$ or $R^2$; a each independently represents an integer of 2 or more; b each independently represents an integer of 0 or more; and X represents a group represented by the following formula (3):

[Chemical Formula 3]

$$—Y—Z—Y— \qquad (3)$$

where Y each independently represents an —O— bond or a divalent hydrocarbon group having a carbon number of 1 to 6; and Z represents a group represented by the following formula (4):

[Chemical Formula 4]

$$—(R^4{}_2SiO)_c—(R^4{}_nQ_{2-n}SiO)_d—SiR^4{}_2— \qquad (4)$$

where $R^4$ each independently represents a substituted or unsubstituted monovalent hydrocarbon group having a carbon number of 1 to 10; c represents an integer of 0 or more; d represents an integer of 0 or more; n represents 0 or 1; and Q represents a group represented by the following formula (5):

[Chemical Formula 5]

$$-P_0-P_1 \quad (5)$$

where $P_0$ represents any of an —O— bond, a divalent hydrocarbon group having a carbon number of 1 to 10 and optionally having ether bond, or ester bond, and a substituted or unsubstituted dimethylsiloxy group; and $P_1$ represents any of a methyl group, a trimethylsilyl group, and a group represented by the following formula (6) or the following formula (7):

[Chemical Formula 6]

(6)

[Chemical Formula 7]

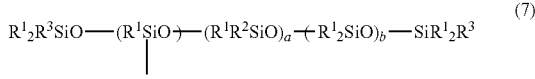
(7)

where $R^1$, $R^2$, $R^3$, a, and b are the same as $R^1$, $R^2$, $R^3$, a, and b in the formula (1) and the formula (2)].

[3]: The curable resin composition according to [1] or [2], wherein (A) the above epoxy compound having three or more epoxy groups in one molecule further comprises an epoxy silicone containing at least (C) a compound represented by the following formula (8) and a compound represented by the following formula (9), the epoxy silicone being represented by an average composition formula (10) where the value of [u/(o+p+q+r+s+t+u+x+y+z)] is in the range of 0.020 or less:

[Chemical Formula 8]

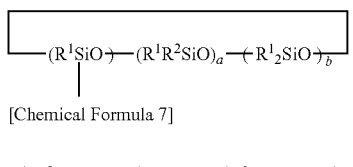
(8)

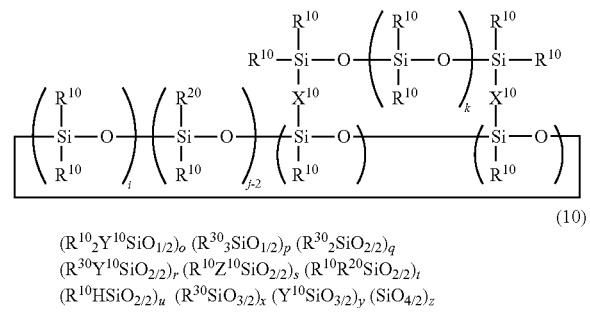
(9)

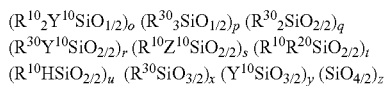
(10)

[where $R^{10}$ each independently represents at least one or more organic groups selected from the group consisting of: A) monovalent aliphatic organic groups having a carbon number of 1 or more and 24 or less and an oxygen number of 0 or more and 5 or less and having aliphatic hydrocarbon units composed of one or more structures selected from the group consisting of unsubstituted or substituted linear, branched, and cyclic structures; B) monovalent aromatic organic groups having a carbon number of 6 or more and 24 or less and an oxygen number of 0 or more and 5 or less and having unsubstituted or substituted aromatic hydrocarbon units optionally having aliphatic hydrocarbon units composed of one or more structures selected from the group consisting of unsubstituted or substituted linear, branched, and cyclic structures; and C) monovalent organic groups having a carbon number of 5 or more and 26 or less, an oxygen number of 0 or more and 5 or less, and one silicon atom and having aliphatic and/or aromatic hydrocarbon units composed of one or more structures selected from the group consisting of unsubstituted or substituted linear, branched and cyclic structures;

$R^{20}$ each independently represents D) an organic group having an epoxy group having a carbon number of 4 or more and 24 or less and an oxygen number of 1 or more and 5 or less and having aliphatic hydrocarbon units composed of one or more structures selected from the group consisting of unsubstituted or substituted linear, branched, and cyclic structures;

$R^{30}$ each independently represents at least one or more organic groups selected from the group consisting of: A) monovalent aliphatic organic groups having a carbon number of 1 or more and 24 or less and an oxygen number of 0 or more and 5 or less and having aliphatic hydrocarbon units composed of one or more structures selected from the group consisting of unsubstituted or substituted linear, branched, and cyclic structures; B) monovalent aromatic organic groups having a carbon number of 6 or more and 24 or less and an oxygen number of 0 or more and 5 or less and having unsubstituted or substituted aromatic hydrocarbon units optionally having aliphatic hydrocarbon units composed of one or more structures selected from the group consisting of unsubstituted or substituted linear, branched, and cyclic structures; C) monovalent organic groups having a carbon number of 5 or more and 26 or less, an oxygen number of 0 or more and 5 or less, and one silicon atom and having aliphatic and/or aromatic hydrocarbon units composed of one or more structures selected from the group consisting of unsubstituted or substituted linear, branched and cyclic structures; and E) monovalent aliphatic organic groups composed of one or more structures selected from the group consisting of unsubstituted or substituted linear and branched structures having a carbon number of 2 or more and 6 or less and including a carbon-carbon double bond;

$X^{10}$ represents a divalent hydrocarbon group composed of one or more structures selected from the group consisting of unsubstituted or substituted linear and branched structures having a carbon number of 2 or more and 6 or less;

$Y^{10}$ each independently represents a divalent hydrocarbon group composed of one or more structures selected from the group consisting of unsubstituted or substituted linear and branched structures having a carbon number of 2 or more and 6 or less;

$Z^{10}$ represents a bond to the divalent hydrocarbon group $Y^{10}$;

i each independently represents an integer of 0 or more; j each independently represents an integer of 3 or more; k represents an integer of 0 or more; o, p, q, r, s, t, u, x, y, and z represent the numbers of moles of the respective structural units present in 1 mol of epoxy silicone; o, s, and t are values of more than 0; p, q, r, u, x, y, and z each are a value of 0 or more and satisfying s=o+r+y;

in the formula (8) and the formula (9), the chain may be random or block].

[4]: The curable resin composition according to [1] to [3], wherein (B) the above active hydrogen compound contains a phenol.
[5]: The curable resin composition according to [1] to [4], wherein (B) the above active hydrogen compound contains a hydrosilane.
[6]: The curable resin composition according to any one of [1] to [5], wherein (B) the above active hydrogen compound contains a phenol and a hydrosilane.
[7]: The curable resin composition according to [1] to [6], wherein (B) the above active hydrogen compound contains three or more active hydrogen atoms in one molecule.
[8]: The curable resin composition according to any one of [1] to [7], wherein the molar amount of active hydrogen in (B) the above active hydrogen compound is 0.01 to 30 mol % based on the molar amount of an epoxy group in the composition.
[9]: The curable resin composition according to any one of [2] to [8], wherein in the above formula (4), d is 0.
[10]: The curable resin composition according to any one of [1] to [9], further comprising a platinum compound.
[11]: The curable resin composition according to any one of [1] to [10], further comprising a heat stabilizer.
[12]: A method of producing a cured product, comprising the step of curing the curable resin composition according to any one of [1] to [11] at a temperature of 50 to 250° C.
[13]: A cured product prepared by curing the curable resin composition according to any one of [1] to [11].
[14]: A sealing material for an optical semiconductor comprising the cured product according to [13].
[15]: A die bonding material for an optical semiconductor comprising the cured product according to [13].
[16]: An optical semiconductor light-emitting element comprising the sealing material for an optical semiconductor according to [14].
[17]: An optical semiconductor light-emitting element comprising the die bonding material for an optical semiconductor according to [15].

Advantageous Effects of Invention

The present invention can provide a cured product having excellent hardness and excellent resistance to yellowing by heat, and provide a curable resin composition suitably used for an optical semiconductor and a cured product thereof, a sealing material and a die bonding material for an optical semiconductor comprising the cured product, and an optical semiconductor light-emitting element using the sealing agent or the die bonding material.

DESCRIPTION OF EMBODIMENTS

Figure 1:
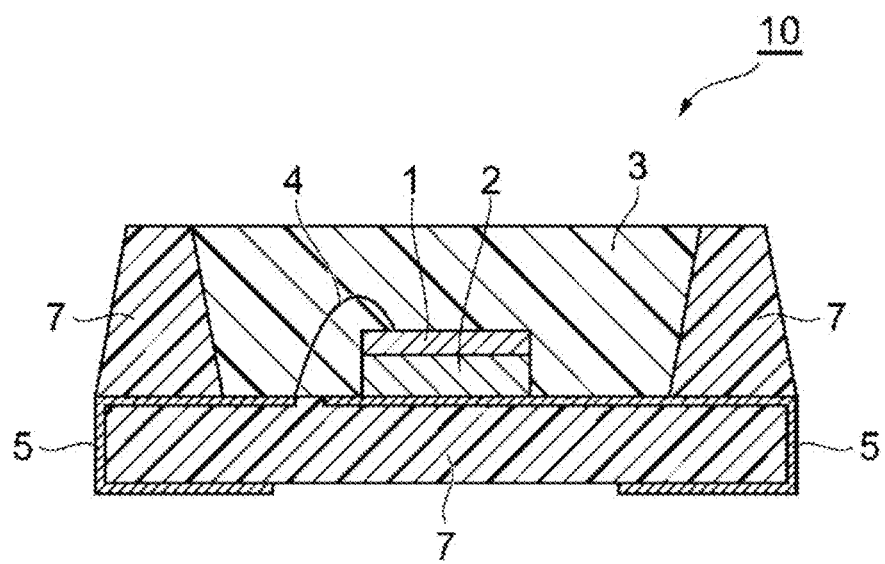
FIG. 1 is a schematic sectional view of an optical semiconductor light-emitting element according to one embodiment.

Hereinafter, the embodiments for implementing the present invention (hereinafter, referred to "the present embodiment") will be described in detail. The present invention is not limited to the embodiments below, and can be modified in various ways within the scope of the gist and implemented.

<(A) Epoxy Compound Having Three or More Epoxy Groups in One Molecule>

The epoxy compound according to the present embodiment (hereinafter, also simply referred to as "component (A)") has three or more epoxy groups in one molecule. Examples of the component (A) include organopolysiloxanes containing a compound represented by the following formula (1) and/or a compound represented by the following formula (2):

[Chemical Formula 9]

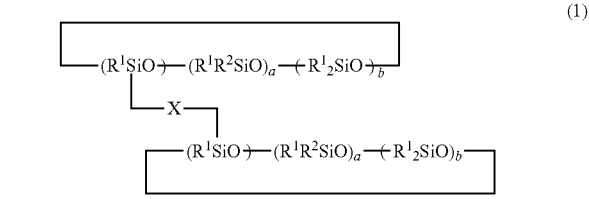

(1)

[Chemical Formula 10]

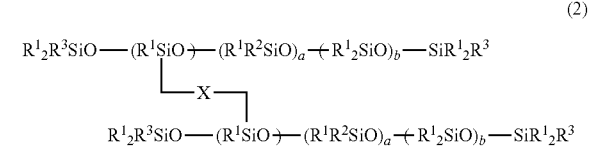

(2)

In the formula (1) and the formula (2), $R^1$ each independently represents a substituted or unsubstituted monovalent hydrocarbon group having a carbon number of 1 to 10; $R^2$ each independently represents an epoxy group-containing organic group; $R^3$ each independently represents $R^1$ or $R^2$, a each independently represents an integer of 2 or more; b each independently represents an integer of 0 or more. X represents a group represented by the formula (3):

[Chemical Formula 11]

$$—Y—Z—Y— \quad (3)$$

In the formula (3), Y each independently represents an —O— bond or a divalent hydrocarbon group having a carbon number of 1 to 6; and Z represents a group represented by the following formula (4):

[Chemical Formula 12]

$$—(R^4{}_2SiO)_c—(R^4{}_nQ_{2-n}SiO)_d—SiR^4{}_2— \quad (4)$$

In the formula (4), $R^4$ each independently represents a substituted or unsubstituted monovalent hydrocarbon group having a carbon number of 1 to 10; c represents an integer of 0 or more; d represents an integer of 0 or more; n represents 0 or 1. Q represents a group represented by the following formula (5):

[Chemical Formula 13]

In the formula (5), $P_0$ represents a divalent hydrocarbon group having a carbon number of 1 to 10 and optionally having an —O— bond, ether bond, or ester bond and represents any of a substituted dimethylsiloxy group and an unsubstituted dimethylsiloxy group; and $P_1$ represents any of a methyl group, a trimethylsilyl group, and a group represented by the following formula (6) or the following formula (7):

[Chemical Formula 14]

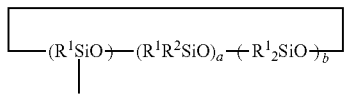

[Chemical Formula 15]

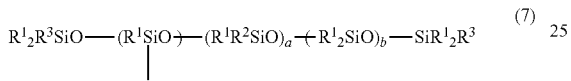

In the formula (6) and the formula (7), $R^1$, $R^2$, $R^3$, a, and b are the same as $R^1$, $R^2$, $R^3$, a, and b in the formula (1) and the formula (2).

In the above formula (1) and the above formula (2), $R^1$ each independently represents a substituted or unsubstituted monovalent hydrocarbon group having a carbon number of 1 to 10. In $R^1$, if the number of carbon atoms is 10 or less, the resistance to yellowing by heat and the weatherability of the cured product are compatible.

From the viewpoint above, preferred examples of $R^1$ include unsubstituted monovalent hydrocarbon groups such as alkyl groups such as a methyl group, an ethyl group, a propyl group, a butyl group, an isobutyl group, a tertiary butyl group, a pentyl group, a neopentyl group, a hexyl group, a cyclopentyl group, a cyclohexyl group, and an octyl group; aryl groups such as a phenyl group and a tolyl group; alkenyl groups such as a vinyl group and an allyl group; or substituted monovalent hydrocarbon groups in which hydrogen atoms of these groups are partially or entirely substituted by a halogen atom such as fluorine, a glycidyl group, a methacryloyl group, an acryloyl group, a mercapto group, an amino group or the like.

Among these, more preferred are a methyl group and a phenyl group because of high resistance to yellowing by heat and high weatherability of the cured product, and particularly preferred is a methyl group because of particularly high weatherability.

In the formula (1) and the formula (2), $R^2$ each independently represents an epoxy group-containing organic group. $R^2$ is preferably a cycloalkyl group having a carbon number of 3 to 60 and containing an epoxy group in the ring so that the cured product has high resistance to yellowing by heat, more preferably a cycloalkyl group having a carbon number of 4 to 12 and containing an epoxy group in the ring, still more preferably a cycloalkyl group having a carbon number of 5 to 8 and containing an epoxy group in the ring, most preferably a cycloalkyl group having a carbon number of 6 and containing an epoxy group in the ring (cyclohexene oxide group).

In the formula (1) and the formula (2), $R^3$ each independently represents $R^1$ or $R^2$; in view of the balance between the viscosity of organopolysiloxane and the resistance to yellowing by heat of the cured product, more preferred are a methyl group and a cyclohexene oxide group.

In the formula (1) and the formula (2), a each independently represents an integer of 2 or more; in view of the balance between the viscosity of the organopolysiloxane and the resistance to yellowing by heat of the cured product, preferred is an integer of 2 or more and 20 or less, more preferred is an integer of 2 or more and 10 or less, still more preferred is an integer of 3 or more and 10 or less.

In the formula (1) and the formula (2), b each independently represents an integer of 0 or more. As b is smaller, the balance between mechanical strength of the cured product such as resistance to yellowing by heat, weatherability, and hardness is better: from such a viewpoint, b is in the range of preferably 0 or more and 20 or less, more preferably 0 or more and 10 or less, still more preferably 0 or more and 5 or less, most preferably 0.

It is preferred that in the formula (2), $R^2$ and $R^3$ have 3 or more and 10 or less epoxy groups in total.

In the formula (1) and the formula (2), X represents a group represented by the following formula (3):

[Chemical Formula 16]

In the formula (3), Y each independently represents —O— or a divalent hydrocarbon group having a carbon number of 1 to 6; examples thereof include —(CH$_2$)—, —(CH$_2$)$_2$—, —(CH$_2$)$_3$—, —(CH$_2$)$_4$—, —(CH$_2$)$_5$—, —(CH$_2$)$_6$—, —CH(CH$_3$)CH$_2$—, and —C(CH$_3$)$_2$—. It is preferred that Y be a divalent hydrocarbon group having a carbon number of 1 to 4. Specifically, to provide a cured product readily produced, little colored, and having high weatherability and high thermal shock properties, more preferred are —(CH$_2$)$_2$—, —(CH$_2$)$_3$—, and —(CH$_2$)$_4$—, and most preferred is —(CH$_2$)$_2$—.

In the formula (3), Z represents a group represented by the following formula (4):

[Chemical Formula 17]

In the formula (4), $R^4$ each independently represents a substituted or unsubstituted monovalent hydrocarbon group having a carbon number of 1 to 10. The number of carbon atoms of $R^4$ is 10 or less in view of the resistance to yellowing by heat and the weatherability of the cured product. Examples of preferred $R^4$ include alkyl groups such as a methyl group, an ethyl group, a propyl group, a butyl group, an isobutyl group, a tertiary butyl group, a pentyl group, a neopentyl group, a hexyl group, a cyclopentyl group, a cyclohexyl group, and an octyl group; aryl groups such as a phenyl group and a tolyl group; and alkenyl groups such as a vinyl group and an allyl group; because of high resistance to yellowing by heat and the weatherability of the cured product, more preferred are a methyl group and a phenyl group, and most preferred is a methyl group because of particularly high weatherability of the cured product.

In the formula (4), c represents an integer of 0 or more. As c is smaller, the resistance to yellowing by heat of the cured product is higher; as c is larger, a cured product having toughness and high thermal shock resistance is likely to be provided. From the viewpoint of the balance between these, c is in the range of preferably 0 or more and 100 or less, more preferably 0 or more and 50 or less, still more preferably 1 or more and 40 or less, most preferably 1 or more and 30 or less.

In the formula (4), n represents 0 or 1, and is preferably 1 because the advantageous effects of the present invention can be remarkably demonstrated.

In the formula (4), d represents an integer of 0 or more. In view of a reduction in the viscosity of the resin composition and an enhancement in the toughness and adhesion of the cured product, d is preferably smaller, particularly preferably 0.

In the formula (4), Q represents a group represented by the formula (5):

[Chemical Formula 18]

(5)

In the formula (5), $P_0$ represents any of a divalent hydrocarbon group having a carbon number of 1 to 10 and optionally having an —O— bond, ether bond, or ester bond, and a substituted or unsubstituted dimethylsiloxy group. Specific examples thereof include —$CH_2CH_2$—, —O—, —$(CH_2)_3$—OCO—$CH(CH_3)CH_2$—, —$(OSi(CH_3)_2)_7$—O—, and —$CH_2CH_2$—$(Si(CH_3)_2O)_7Si$—$CH_2CH_2$—; the raw material for the structure of —$C_2H_4$— is industrially readily available.

In the formula (5), $P_1$ represents any structure of a methyl group, a trimethylsilyl group, and a group represented by the formula (6) or the formula (7), and is preferably a group represented by the formula (6) because the advantageous effects of the present invention can be remarkably demonstrated. In the formula (6) and the formula (7), $R^1$, $R^2$, $R^3$, a, and b are the same as $R^1$, $R^2$, $R^3$, a, and b in the formula (1) and the formula (2).

[Chemical Formula 19]

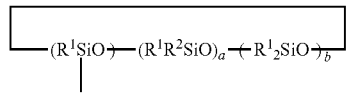

(6)

[Chemical Formula 20]

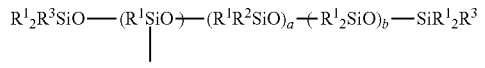

(7)

In the present embodiment, it is preferred that the component (A) be organopolysiloxane containing a compound represented by the formula (1) and/or the formula (2). In this organopolysiloxane, a site in which epoxy groups are present in a relatively high concentration, namely, a site other than X in the formula (1) and the formula (2) and a site X in which epoxy groups are present in a relatively low concentration or are not present are present in the same molecule. Among these, the site in which epoxy groups are present in a relatively high concentration contributes to the demonstration of mechanical strength and thermal properties. Since the site X has a softer structure, the site X plays a role in absorbing internal stress to demonstrate high adhesion and thermal shock properties as a result. Furthermore, the concentration of epoxy groups not always contributing to the weatherability of the cured product is reduced by introduction of the site X; for this reason, the site X has an effect of demonstrating high weatherability.

From such a viewpoint, the compound represented by the formula (1) more remarkably demonstrates the advantageous effects of the present invention, and therefore is particularly preferred. More specifically, compared to the compound represented by the formula (1) and the compound represented by the formula (2), preferred is the compound represented by the formula (1), which has a good balance between hardness and resistance to yellowing by heat.

The weight average molecular weight of the component (A) in the present embodiment is not particularly limited, and it is preferred that weight average molecular weight be 700 or more and 500000 or less. If the weight average molecular weight is 700 or more, the cured product has high weatherability. From such a viewpoint, the range of the weight average molecular weight of the component (A) is more preferably 1000 or more and 100000 or less, still more preferably 1000 or more and 20000 or less, most preferably 1000 or more and 10000 or less. The weight average molecular weight of the component (A) is specified by the weight average molecular weight measured by GPC. Specifically, for example, columns TSKguard column HHR-H, TSKgel G5000 HHR, TSKgel G3000 HHR, and TSKgel G1000 HHR manufactured by Tosoh Corporation are connected in series, and used; chloroform is used as a mobile phase, and analysis is performed at a rate of 1 mL/min. As a detector, an RI detector is used, and Easy Cal PS-2 (molecular weight distribution: 580 to 377400) polystyrene manufactured by Polymer Laboratories and a styrene monomer (molecular weight: 104) are used as standard substances to determine the weight average molecular weight.

It is preferred that the epoxy value of the component (A) in the present embodiment be 0.050 (equivalent/100 g) or more from the viewpoint of resistance to yellowing by heat and be 0.500 (equivalent/100 g) or less from the viewpoint of weatherability. From such a viewpoint, the epoxy value is more preferably 0.100 (equivalent/100 g) or more and 0.450 (equivalent/100 g) or less, most preferably 0.150 (equivalent/100 g) or more and 0.400 (equivalent/100 g).

It is preferred that the content of the compound represented by the formula (1) or the formula (2) contained in the organosiloxane be 0.01% by mass or more and 100% by mass or less based on the total amount of the component (A). The content of the compound represented by the formula (1) or the formula (2) is more preferably 0.1% by mass or more and 90% by mass or less, still more preferably 5% by mass or more and 60% by mass or less, most preferably 10% by mass or more and 50% by mass or less based on the total amount of the component (A).

The organopolysiloxane, an example of the epoxy compound having three or more epoxy groups in one molecule can be obtained by a combination of an addition reaction of part of SiH groups contained in organohydropolysiloxane (i) and an alkenyl group in a compound (ii) having an epoxy group and an alkenyl group in one molecule with an addition reaction of part of SiH groups also contained in (i) and unsaturated bonds in organopolysiloxane (iii) having unsaturated bonds such as a vinyl group at both terminals.

At this time, it is preferred that as the proportion of the organohydropolysiloxane (i), the compound (ii) having an epoxy group and an alkenyl group in one molecule, and the organopolysiloxane (iii) having unsaturated bonds such as a vinyl group at both terminals used, the ratio of the number of moles of the total vinyl groups contained in (ii) and (iii) to that of the SiH group contained in (i) be 0.8/1.0 to 1.2/1.0. It is preferred that the molar ratio be 0.8/1.0 or more from the viewpoint of weatherability and resistance to yellowing by heat, and be 1.2/1.0 or less from the viewpoint of the stability of viscosity and the resistance to yellowing by heat and the strength of the cured product. The molar ratio is preferably closer to 1.0, more preferably 0.95/1.0 to 1.05/1.0.

In the addition reaction, the proportion of the compound (ii) having an epoxy group and an alkenyl group in one molecule and the organopolysiloxane (iii) having unsaturated bonds such as a vinyl group at both terminals used is not particularly limited; it is preferred that the molar ratio of vinyl groups contained be 1:100 or more from the viewpoint of resistance to yellowing by heat, and be 100:1 or less from the viewpoint of weatherability. The molar ratio is more preferably 95:5 to 20:80, still more preferably 90:10 to 40:60, most preferably 80:20 to 50:50.

In the reaction of the compound (ii) having an epoxy group and an alkenyl group in one molecule and the organopolysiloxane (iii) having unsaturated bonds such as a vinyl group at both terminals to the organohydropolysiloxane (i), (ii) and (iii) may be simultaneously added, or any one of (ii) and (iii) may be added first to perform the reaction in advance. In this case, if (ii) is reacted first, the viscosity of the resulting organopolysiloxane tends to be low: if (iii) is reacted first, organopolysiloxane little colored tends to be obtained. If any one of (ii) and (iii) is reacted with (i) first, the remaining other one may be reacted subsequently or the other one may be reacted after intermediate polysiloxane is separated.

In the addition reaction, it is preferred to use a catalyst to accelerate the reaction faster. Examples of the catalyst include platinum-based catalysts such as chloroplatinic acid, alcohol solutions of chloroplatinic acid, reaction products of chloroplatinic acid and alcohol, reaction products of chloroplatinic acid and olefin compounds, and reaction products of chloroplatinic acid and vinyl group-containing siloxane.

The amount of these catalysts to be added is not particularly limited; it is preferred that the amount be 0.0001 to 5% by weight of the total weight of the organohydropolysiloxane (i), the compound (ii) having an epoxy group and an alkenyl group in one molecule, and the organopolysiloxane (iii) having unsaturated bonds such as a vinyl group at both terminals. It is preferred that the amount of the catalyst to be added be 0.0001% by weight or more to obtain the effect of addition, and be 5% by weight or less in view of the weatherability of the cured product of the resulting organohydropolysiloxane.

The addition reaction can be usually performed at room temperature to 300° C., and the reaction progresses faster at 30° C. or more. A reaction performed at 120° C. or less is preferred because organohydropolysiloxane little colored is obtained. The reaction time is not particularly limited, and 1 to 50 hours are preferred.

A reaction performed in a solvent when necessary is preferred because the viscosity of the resulting organopolysiloxane is low. As the solvent, aromatic solvents such as toluene and xylene, aliphatic-based solvents such as hexane and octane, ketone-based solvents such as methyl ethyl ketone and methyl isobutyl ketone, ester-based solvents such as ethyl acetate and isobutyl acetate, ether-based solvents such as diisopropyl ether, 1,4-dioxane, diethyl ether, tetrahydrofuran, ethylene glycol dimethyl ether, ethylene glycol diethyl ether, and propylene glycol monomethyl ether acetate, alcohol-based solvents such as isopropanol, or mixed solvents thereof can be used; particularly preferred is dioxane because it has high solubility to the organohydropolysiloxane (i), the compound (ii) having an epoxy group and an alkenyl group in one molecule, and the organopolysiloxane (iii) having unsaturated bonds such as a vinyl group at both terminals and is likely to progress the reaction fast.

The atmosphere for the reaction may be any of the air or an inert gas; preferred is in an inert gas such as nitrogen, argon, or helium because the coloration of the resulting organopolysiloxane is little.

After the completion of the addition reaction, the addition reaction catalyst can be removed by a standard method such as washing of the reaction mixture with water or a treatment with activated carbon. If the solvent is used, the solvent can be distilled off under heating and/or reducing pressure to obtain organopolysiloxane, i.e., the component (A).

In the present embodiment, it is preferred that (A) an epoxy compound having three or more epoxy groups in one molecule further comprise an epoxy silicone represented by the average composition formula (10) wherein the value of $[u/(o+p+q+r+s+t+u+x+y+z)]$ is in the range of 0.020 or less, the epoxy silicone containing at least (C) a compound represented by the following formula (8) and a compound represented by the following formula (9):

[Chemical Formula 21]

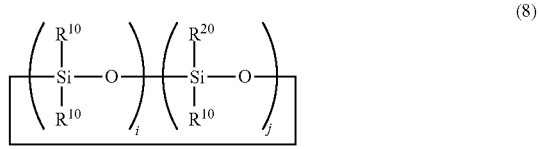

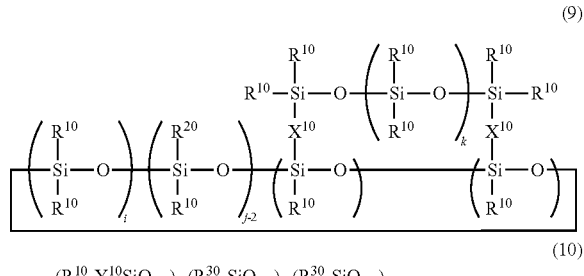

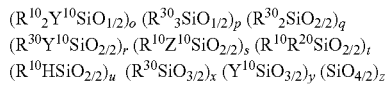

$(R^{10}{}_2Y^{10}SiO_{1/2})_o$ $(R^{30}{}_3SiO_{1/2})_p$ $(R^{30}{}_2SiO_{2/2})_q$
$(R^{30}Y^{10}SiO_{2/2})_r$ $(R^{10}Z^{10}SiO_{2/2})_s$ $(R^{10}R^{20}SiO_{2/2})_t$
$(R^{10}HSiO_{2/2})_u$ $(R^{30}SiO_{3/2})_x$ $(Y^{10}SiO_{3/2})_y$ $(SiO_{4/2})_z$

Here, in the formula (8), the formula (9), and in the average composition formula (10), $R^{10}$ each independently represents at least one or more organic groups selected from the group consisting of: A) monovalent aliphatic organic groups having a carbon number of 1 or more and 24 or less and an oxygen number of 0 or more and 5 or less and having aliphatic hydrocarbon units composed of one or more structures selected from the group consisting of unsubstituted or substituted linear, branched, and cyclic structures; B) monovalent aromatic organic groups having a carbon number of 6 or more and 24 or less and an oxygen number of 0 or more and 5 or less and having unsubstituted or substituted aromatic hydrocarbon units optionally having aliphatic hydrocarbon units composed of one or more structures selected from the group consisting of unsubstituted or substituted linear, branched, and cyclic structures; and C) monovalent organic groups having a carbon number of 5 or more and 26 or less, an oxygen number of 0 or more and 5 or less, and one silicon atom and having aliphatic and/or aromatic hydrocarbon units composed of one or more structures selected from the group consisting of unsubstituted or substituted linear, branched and cyclic structures.

$R^{20}$ each independently represents D) an organic group having an epoxy group having a carbon number of 4 or more and 24 or less and an oxygen number of 1 or more and 5 or less and having aliphatic hydrocarbon units composed of one or more structures selected from the group consisting of unsubstituted or substituted linear, branched, and cyclic structures.

$R^{30}$ each independently represents at least one or more organic groups selected from the group consisting of: A) monovalent aliphatic organic groups having a carbon number of 1 or more and 24 or less and an oxygen number of 0 or more and 5 or less and having aliphatic hydrocarbon units composed of one or more structures selected from the group consisting of unsubstituted or substituted linear, branched, and cyclic structures; B) monovalent aromatic organic groups having a carbon number of 6 or more and 24 or less and an oxygen number of 0 or more and 5 or less and having unsubstituted or substituted aromatic hydrocarbon units optionally having aliphatic hydrocarbon units composed of one or more structures selected from the group consisting of unsubstituted or substituted linear, branched, and cyclic structures; C) monovalent organic groups having a carbon number of 5 or more and 26 or less, an oxygen number of 0 or more and 5 or less, and one silicon atom and having aliphatic and/or aromatic hydrocarbon units composed of one or more structures selected from the group consisting of unsubstituted or substituted linear, branched and cyclic structures; and E) monovalent aliphatic organic groups composed of one or more structures selected from the group consisting of unsubstituted or substituted linear and branched structures having a carbon number of 2 or more and 6 or less and including a carbon-carbon double bond.

$X^{10}$ represents a divalent hydrocarbon group composed of one or more structures selected from the group consisting of unsubstituted or substituted linear and branched structures having a carbon number of 2 or more and 6 or less.

Moreover, $Y^{10}$ each independently represents a divalent hydrocarbon group composed of one or more structures selected from the group consisting of unsubstituted or substituted linear and branched structures having a carbon number of 2 or more and 6 or less.

Furthermore, $Z^{10}$ represents a bond to the divalent hydrocarbon group $Y^{10}$.

i each independently represents an integer of 0 or more, j each independently represents an integer of 3 or more, and k represents an integer of 0 or more. Moreover, o, p, q, r, s, t, u, x, y, and z represent the numbers of moles of the respective structural units present in 1 mol of epoxy silicone; o, s, and t are values of more than 0; p, q, r, u, x, y, and z each are a value of 0 or more and satisfying s=o+r+y.

In the formula (8) and the formula (9), the chain may be random or block.

Here, in the average composition formula (10), if x, y, and z satisfy the following expression (11) and expression (12) at the same time, o, p, x, y, and z are numeric values selected in the range satisfying the formula (13):

$x+y \neq 0$  Expression (11)

$z \neq 0$  Expression (12)

$0 \leq p \leq o+(x+y)+2z+2$  Expression (13)

Moreover, if x, y, and z satisfy the following expression (14) and expression (15) at the same time, o and p are numeric values selected in the range satisfying the following expression (16):

$x+y=0$  Expression (14)

$z=0$  Expression (15)

$0 \leq p \leq o+2$  Expression (16)

Moreover, if x, y, and z each satisfy the following expression (11) and expression (15) at the same time, o, p, x, and y are numeric values selected in the range satisfying the following expression (17):

$x+y \neq 0$  Expression (11)

$z=0$  Expression (15)

$0 \leq p \leq o+(x+y)+2$  Expression (17)

Furthermore, if x, y, and z satisfy the following expression (14) and expression (12) at the same time, o, p, and z are numeric values selected in the range satisfying the following expression (18):

$x+y=0$  Expression (14)

$z \neq 0$  Expression (12)

$0 \leq p \leq o+2z+2$  Expression (18)

The bicyclo structure represented by the formula (9) is a component playing an important role in demonstration of the excellent lightfastness, crack resistance, and adhesion in a cured product obtained by curing epoxy silicone. It is difficult to obtain sufficient lightfastness, crack resistance, and adhesion after curing only with the monocyclo structure represented by the formula (8). In order to further improve the lightfastness, the crack resistance, and the adhesion of the cured product, the value of the ratio [WB]/[WA] is preferably within a specific range where the content of the compound having the monocyclo structure represented by the formula (8) is defined as [WA] and the content of the compound having the bicyclo structure represented by the formula (9) is defined as [WB].

As a method of calculating the ratio of the content of the compound represented by the formula (8) and the content of the compound represented by the formula (9), matrix assisted ionization time of flying mass spectrometry (hereinafter, referred to as MALDI-TOF/MS) is used, and the value of [WB]/[WA] is calculated from the following expression (I) using the peak intensity of the compound represented by the formula (8) and the peak intensity of the compound represented by the formula (9) obtained in the measurement of epoxy silicone of the present invention by MALDI-TOF/MS:

[Expression 1]

$$[WB]/[WA] = \frac{\text{Intensity of peak corresponding to the total mass of the mass corresponding to the structure represented by the formula (9) and the mass (23) of sodium}}{\text{Intensity of peak corresponding to the total mass of the mass corresponding to the structure represented by the formula (8) and the mass (23) of sodium}} \quad (I)$$

<(B) Active Hydrogen Compound>

The active hydrogen compound (B) of the present embodiment is a compound which has or generates active hydrogen. Here, active hydrogen refers to protons, hydrogen radicals, and hydrides. The "active hydrogen compound (B)" more specifically refers to compounds having a hydrogen atom bonded to an oxygen atom, a sulfur atom, a nitrogen atom, a silicon atom, or the like and a hydrogen atom in a terminal methine group, for example, compounds having an —OH group, a —C(=O)OH group, a —C(=O)H group, an —SH group, an —SO$_3$H group, an —SO$_2$H group, an —SOH group, an —NH$_2$ group, an —NH- group, an —SiH group, and a —C≡CH group.

Examples of the active hydrogen compound (B) include phenols having at least one phenol group in the molecule and hydrosilanes having at least one hydrosilyl group in the molecule.

Specific examples of the phenols include phenol, cresol, chlorophenol, salicylic acid, 2,6-dimethylphenol, 2,6-dimethylxylenol, bis(t-butyl)hydroxytoluene (BHT), and hindered phenol-based antioxidants manufactured by BASF SE such as IRGANOX 1010, IRGANOX 1035, IRGANOX 1076, IRGANOX 1098, IRGANOX 1135, IRGANOX 1330, IRGANOX 1726, IRGANOX 1425, IRGANOX 1520, IRGANOX 245, IRGANOX 259, IRGANOX 3114, IRGANOX 565, and IRGAMOD 295.

Specific examples of the hydrosilanes include monosilanes such as trimethylhydrosilane, triethylhydrosilane, tripropylhydrosilane, tributylhydrosilane, tripentylhydrosilane, trihexylhydrosilane, triphenylhydrosilane, dimethyldihydrosilane, diethyldihydrosilane, dipropyldihydrosilane, dibutyldihydrosilane, dipentyldihydrosilane, dihexyldihydrosilane, diphenyldihydrosilane, methyltrihydrosilane, ethyltrihydrosilane, propyltrihydrosilane, butyltrihydrosilane, pentyltrihydrosilane, hexyltrihydrosilane, and phenyltrihydrosilane; and polysiloxanes such as 1,3,5-trimethylcyclotrisiloxane, 1,3,5,7-tetramethylcyclotetrasiloxane, 1,3,5,7,9-pentamethylcyclopentasiloxane, 1,3,5,7,9,11-hexamethylcyclohexasiloxane, 1,3,5,7,9,11,13-heptamethylcycloheptasiloxane, 1,3,5,7,9,11,13,15-octamethylcyclooctasiloxane, 1,3,5,7,9,11,13,15,17-nonamethylcyclononasiloxane, 1,3,5,7,9,11,13,15,17,19-decamethylcyclodecasiloxane, 1,3,5,7,9,11,13,15,17,19,21-dodecamethyldodecasiloxane, 1,1,3,5-tetramethylcyclotrisiloxane, 1,1,3,5,5,7-hexamethylcyclotetrasiloxane, 1,3,5-triethylcyclotrisiloxane, 1,3,5,7-tetraethylcyclotetrasiloxane, 1,3,5,7,9-pentaethylcyclopentasiloxane, 1,3,5,7,9-pentaethylcyclopentasiloxane, 1,3,5,7,9,11-hexaethylcyclohexasiloxane, 1,3,5,7,9,11,13-heptaethylcycloheptasiloxane, 1,3,5,7,9,11,13,15-octaethylcyclooctasiloxane, 1,3,5,7,9,11,13,15,17-nonaethylcyclononasiloxane, 1,3,5,7,9,11,13,15,17,19-decaethylcyclodecasiloxane, and 1,3,5,7,9,11,13,15,17,19,21-dodecaethyldodecasiloxane.

Examples of active hydrogen compounds other than the above compounds include aliphatic carboxylic acids such as formic acid, acetic acid, propionic acid, butyric acid, isobutyric acid, valeric acid, isovaleric acid, caproic acid, enanthic acid, caprylic acid, pelargonic acid, capric acid, lauric acid, myristic acid, pentadecylic acid, palmitic acid, margaric acid, stearic acid, oleic acid, linoleic acid, linolenic acid, tuberculostearic acid, arachidic acid, arachidonic acid, eicosapentaenoic acid, behenic acid, docosahexaenoic acid, lignoceric acid, cerotic acid, montanic acid, and melissic acid; aliphatic carboxylic acids having a plurality of reactive functional groups, such as oxalic acid, lactic acid, tartaric acid, maleic acid, fumaric acid, malonic acid, succinic acid, malic acid, citric acid, aconitic acid, glutaric acid, adipic acid, amino acid, and L-ascorbic acid; aromatic carboxylic acids such as benzoic acid, salicylic acid, gallic acid, phthalic acid, cinnamic acid, and mellitic acid; esters of alcohols having a carbon number of 1 to 50 and sulfuric acid; alkylsulfonic acids having an alkyl group having a carbon number of 1 to 50; alkylphosphoric acids having an alkyl group having a carbon number of 1 to 50; alkylnitric acids having an alkyl group having a carbon number of 1 to 50; active hydrogen-containing organic substances such as alcohols having a carbon number of 1 to 50; and hydrochloric acid, nitric acid, sulfuric acid, molybdic acid, inorganic acids such as tungstic acid, and heteropoly acid.

The active hydrogen compound (B) is preferably hydrosilanes and active hydrogen-containing organic substances, in terms of not reducing the resistance to yellowing by heat of the cured product, and is preferably phenols, in terms of enhancing the resistance to yellowing by heat of the cured product.

Among phenols, particularly preferred are hindered phenols, since hindered phenols remarkably enhance the stability of the cured product. Although the cause how the hindered phenols remarkably enhance the stability of the cured product is not clear, it is conceivable that the hindered phenols also function as an antioxidant and radical reaction inhibitor to enhance the thermal stability of the cured product.

Among these, in view of high resistance to yellowing by heat of the cured product, the active hydrogen compound is preferably hydrosilanes, most preferably polysiloxanes.

Of course, it is particularly preferred to use both phenols such as hindered phenols and hydrosilanes as the active hydrogen compound.

It is preferred that the active hydrogen compound contain 0.001 to 10% by weight of hydrosilanes and 0.001 to 10% by weight of phenols based on the total amount of the curable composition.

In view of the hardness of the cured product, it is preferred that the active hydrogen compound contain two or more active hydrogen atoms in one molecule, and it is more preferred that the active hydrogen compound contain three or more active hydrogen atoms in one molecule. The organopolysiloxane of the present embodiment has a structure in which epoxy groups are introduced into terminals of a bulky silicone skeleton composed of connected cyclic polysiloxane skeletons. Unlike standard ring-opening polymerization of the epoxy group, in such a structure, the distance between epoxy groups in the composition is long; for this reason, an increase in molecular weight has been difficult and the hardness of the cured product has been insufficient. Then, it is conceivable that a polymerization initiator having a plurality of active hydrogen atoms in one molecule can take a large amount of polyether into the molecule, and as a result the molecular weight can be increased.

<Curable Resin Composition>

The curable resin composition of the present embodiment is characterized by containing the epoxy compound (A) having three or more epoxy groups in one molecule and the active hydrogen compound (B).

In the curable resin composition of the present embodiment, it is preferred that the molar amount of active hydrogen in the active hydrogen compound (B) be 0.01 to 30 mol % based on the total molar amount of epoxy groups in the curable resin composition. In view of the reaction rate, the molar amount may be 0.02 mol % or more, 0.03 mol % or more, or 0.05 mol % or more. In view of the molecular weight, it is more preferred that the molar amount be 25 mol % or less, and it is still more preferred that the molar amount be 0.05 to 22 mol % or 0.06 to 22 mol %.

The molecular weight of polyether to be obtained is affected by the number of moles of the active hydrogen compound to be used and/or the number of moles of active hydrogen in one molecule; for this reason, to increase the molecular weight of polyether, it is preferred that the number of moles of the active hydrogen compound to be used be reduced and the number of moles of active hydrogen in one molecule be reduced.

The hindered phenols as the active hydrogen compound also has an effect of functioning as a heat stabilizer. It is preferred that the molar amount of active hydrogen in the hindered phenols be 0.03 to 2 mol % based on the total molar amount of the epoxy group in the curable resin composition.

The hindered phenols as the active hydrogen compound also has an effect of functioning as a radical reaction inhibitor. The hindered phenols function as the radical reaction inhibitor to inhibit the radical reaction of a polymerization initiator having active hydrogen (B) and hydroxyl groups, and in turn inhibit generation of air bubbles in the cured product due to hydrogen gas.

The polysiloxanes as active hydrogen compounds are the compounds having the same structure as that of organopolysiloxane exemplified as an epoxy compound having three or more epoxy groups in one molecule, which is the component (A) of the present embodiment; the polysiloxanes have mutual solubility with organopolysiloxane, and allow the resulting polyether to have higher molecular weights. It is preferred that the molar amount of active hydrogen in polysiloxane be 1 to 30 mol % based on the molar amount of the epoxy group in the curable resin composition.

In the curable resin composition of the present embodiment, a substance reactive with an epoxy group may be contained in the ranges of the amount and quality not deviating from the ranges of the present invention. Examples of the substance reactive with an epoxy group include carboxylic anhydrides, polyols, silane coupling agents, Lewis acidic polymerization initiators, and platinum compounds.

Specific examples of the carboxylic anhydrides include phthalic anhydrides, methylhexahydrophthalic anhydrides, hexahydrophthalic anhydrides, norbornane-2,3-dicarboxylic anhydrides, and methylnorbornane-2,3-dicarboxylic anhydrides.

Specific examples of the polyols include ethylene glycol, propylene glycol, glycerol, diethylene glycol, and triethylene glycol.

Specific examples of the silane coupling agent include 3-glycidoxypropyltrimethoxysilane, 3-glycidoxypropyltriethoxysilane, 3-glycidoxypropylmethyldimethoxysilane, 3-glycidoxypropylmethyldiethoxysilane, 3-glycidoxypropyldimethylmethoxysilane, 3-glycidoxypropyldimethylethoxysilane, 2-(3,4-epoxycyclohexyl)ethyltrimethoxysilane, 2-(3,4-epoxycyclohexyl)ethyltriethoxysilane, 3-aminopropyltrimethoxysilane, 3-aminopropyldimethylethoxysilane, 3-aminopropylmethyldiethoxysilane, 3-aminopropyldimethylethoxysilane, N-(2-aminoethyl)aminomethyltrimethoxysilane, N-(2-aminoethyl)(3-aminopropyl)trimethoxysilane, N-(2-aminoethyl)(3-aminopropyl)triethoxysilane, N-(2-aminoethyl)(3-aminopropyl)methyldimethoxysilane, N—[N'-(2-aminoethyl)(2-aminoethyl)][3-aminopropyl]trimethoxysilane, 2-(2-aminoethyl)thioethyltriethoxysilane, 2-(2-aminoethyl)thioethylmethyldiethoxysilane, 3-(N-phenylamino)propyltrimethoxysilane, 3-(N-cyclohexylamine)propyltrimethoxysilane, (N-phenylaminomethyl)trimethoxysilane, (N-phenylaminomethyl)methyldimethoxysilane, (N-cyclohexylaminomethyl)triethoxysilane, (N-cyclohexylaminomethyl)methyldiethoxysilane, piperazinomethyltrimethoxysilane, piperazinomethyltriethoxysilane, 3-piperazinopropyltrimethoxysilane, 3-piperazinopropylmethyldimethoxysilane, 3-ureidopropyl triethoxysilane, mercaptomethyltrimethoxysilane, mercaptomethyltriethoxysilane, mercaptomethylmethyldimethoxysilane, mercaptomethylmethyldiethoxysilane, 3-mercaptopropyltrimethoxysilane, 3-mercaptopropyltriethoxysilane, 3-mercaptopropylmethyldimethoxysilane, 3-mercaptopropylmethyldiethoxysilane, 3-(trimethoxysilyl)propylsuccinic anhydrides, 3-(triethoxysilyl)propylsuccinic anhydrides, tetramethoxysilane, tetraethoxysilane, methyltrimethoxysilane, methyltriethoxysilane, ethyltrimethoxysilane, ethyltriethoxysilane, propyltrimethoxysilane, propyltriethoxysilane, vinyltrimethoxysilane, vinyltriethoxysilane, cyclohexyltrimethoxysilane, cyclohexyltriethoxysilane, cyclopentyltrimethoxysilane, cyclopentyltriethoxysilane, phenyltrimethoxysilane, phenyltriethoxysilane, dimethyldimethoxysilane, dimethyldiethoxysilane, methylvinyldimethoxysilane, methylvinyldiethoxysilane, methylphenyldimethoxysilane, methylphenyldiethoxysilane, methylcyclohexyldimethoxysilane, methylcyclohexyldiethoxysilane, methylcyclopentyldimethoxysilane, methylcyclopentyldiethoxysilane, 3-methacryloxypropylmethyldiethoxysilane, 3-methacryloxypropyltrimethoxysilane, 3-methacryloxypropylmethyldiethoxysilane, and 3-methacryloxypropyltriethoxysilane.

The Lewis acidic polymerization initiators may be any ones having Lewis acidity, and examples thereof include Lewis acidic polymerization initiators usually used in ring-opening polymerization of an epoxy group. Specific examples thereof include $BF_3$.amine complex, $PF_5$, $BF_3$, $AsF_5$, and $SbF_5$. From the viewpoint of control of the reaction rate, it is preferred to add a Lewis acidic polymerization initiator to the curable resin composition of the present embodiment.

Examples of the platinum compounds include platinum-based catalysts such as chloroplatinic acid, alcohol solutions of chloroplatinic acid, reaction products of chloroplatinic acid and alcohols, reaction products of chloroplatinic acid and olefin compounds, and reaction products of chloroplatinic acid and vinyl group-containing siloxanes.

Specifically, for example, U.S. Pat. No. 3,775,452 discloses a complex having an unsaturated siloxane as a ligand, which is known as a Karstedt catalyst. Examples of other platinum-based catalysts described in the documents include Ashby catalysts disclosed in U.S. Pat. No. 3,159,601, Lamoreaux catalysts disclosed in U.S. Pat. No. 3,220,972, and Speier catalysts disclosed in Speier, J. L., Webster J. A. and Barnes G. H., J. Am. Chem. Soc. 79, 974 (1957).

From the viewpoint of control of the reaction rate, it is preferred to add a platinum compound to the curable resin composition of the present embodiment.

From the viewpoint of the resistance to yellowing by heat of the cured product, these substances reactive with an epoxy group are preferably 20% by weight or less, more preferably 10% by weight or less, most preferably 5% by weight or less based on the total weight of organopolysiloxane and the active hydrogen compound. If a compound having a hydrosilyl group is present in the curable resin composition, a compound having a hydroxyl group and/or a compound which generates a hydroxyl group by a curing reaction can be added in amounts at a level causing no problems by air bubbles generated by hydrogen gas.

In the curable resin composition of the present embodiment, additives other than above may be contained in the ranges of the amount and quality not deviating from the ranges of the present invention.

Examples of the additives include curing catalysts, curing agents, curing accelerators, reactive diluents, saturated compounds having no unsaturated bond, pigments, dyes, antioxidants, ultraviolet absorbing agents, light stabilizers, photo-selective additives, fluorescent brighteners, process stabilizers, plasticizers, non-reactive compounds, chain transfer agents, thermal polymerization initiators, anaerobic polymerization initiators, polymerization inhibitors, inorganic fillers, organic fillers, adhesion improvers such as coupling agents, heat stabilizers, antibacterial and antifungal agents, flame retardants, matting agents, antifoaming agents, leveling agents, wetting agents, dispersants, anti-sediment agents, thickeners, anti-sagging agents, anti-color separating agents, emulsifiers, lubricants (slip agents), anti-slip and anti-scratch agents, anti-skinning agents, desiccants, anti-staining agents, antistatic agents, and conductive agents (static aides), and heat stabilizers.

From the viewpoint of the thermal stability of the cured product, it is preferred that the curable resin composition further contain a heat stabilizer. Specific examples thereof include sulfur-based heat stabilizers and phosphorus-based heat stabilizers. If a hindered phenol-based polymerization initiator is used as the active hydrogen compound (B), it is preferred to further contain a sulfur-based heat stabilizer from the viewpoint of further enhancing thermal stability. From the viewpoint of the demonstration of the effect and mutual solubility, it is preferred that the heat stabilizer be 0.01 to 1% by weight based on the total weight of the curable resin composition.

It is preferred that the curable resin composition contain a radical reaction inhibitor. By containing a radical reaction inhibitor, the radical reaction between the active hydrogen compound and a hydroxyl group is suppressed to suppress generation of air bubbles in the cured product due to hydrogen gas.

<Method of Producing Cured Product>

The method of producing a cured product of the present invention may be any method having conditions allowing polymerization of an epoxy group. If representative polymerization by heat is used as a very simple method, it is preferred that the temperature be 50 to 250° C. Namely, the method of producing a cured product according to one embodiment comprises a step of curing a curable resin composition at a temperature of 50 to 250° C.

Although ring-opening polymerization of the epoxy group is widely known, it is known that in a compound in which epoxy groups are introduced into the terminals of a bulky silicone skeleton composed of connected cyclic polysiloxane skeletons, as the organopolysiloxane of the present embodiment, the distance between epoxy groups in the composition is long, leading to a problem of the molecular weight being barely increased in the ring-opening polymerization of the epoxy group, and the compound obtains a polyester structure by curing due to a reaction with acid anhydride.

Then, it is preferred that as the condition of the method of producing a cured product, temperature be relatively high to obtain a sufficient curing rate. Meanwhile, in a condition where the temperature is excessively high, the composition in a state of a low molecular weight in the course of curing is exposed to high temperature to cause pyrolysis of the composition or the like. Accordingly, as the curing temperature, 50 to 250° C., 80 to 200° C., or 100 to 200° C. is preferred, and 100 to 180 or 120 to 190° C. is more preferred. Moreover, in the initial stage of the curing reaction, the molecular weight is low and resistance to yellowing by heat is low; for this reason, in the method of producing a cured product, it is preferred that the composition be cured at 80 to 150, or 120 to 160° C., and from the stage where the curing reaction progresses and sufficient resistance to yellowing by heat appears, the composition be cured at a temperature 10° C. or more higher than the temperature of the initial stage and in the temperature range of 120 to 180° C. or the temperature range of 160 to 190° C.

<Cured Product>

The cured product of the present embodiment is obtained by curing the curable resin composition. As a method of obtaining a cured product, the method of producing a cured product is preferred.

It is preferred that the cured product of the present embodiment had an index I of crystallinity of 0.2 to 0.55 represented by the following expression (8):

$$I=Ix/Iy \qquad (8)$$

where Ix: the maximum value of the peak intensity at 2θ of 10 to 25° in the XRD analysis of the cured product,
Iy: the maximum value of the peak intensity at 2θ of 10 to 25° in the XRD analysis of polyethylene terephthalate Namely, it is conceivable that because a higher structure of the cured product of the present embodiment having an index I of crystallinity of 0.2 to 0.55 shows specific crystallinity, the cured product shows high properties not shown in cured products containing polyester as the main component and cured products containing silicone as the main component.

<Sealing Material for Optical Semiconductor and Die Bonding Material for Optical Semiconductor>

The curable resin composition of the present embodiment can be suitably used as a sealing material for an optical semiconductor. Moreover, the curable resin composition of the present invention can be suitably used as a die bonding material for an optical semiconductor.

<Optical Semiconductor Light-Emitting Element>

The light-emitting element can be sealed using the sealing material for an optical semiconductor or using the die bonding material for an optical semiconductor to produce a light emission part such as an optical semiconductor light-emitting element (such as a light emission diode).

The wavelength of the light emission of the optical semiconductor light-emitting element sealed using the sealing material for a semiconductor composed of the curable resin composition of the present embodiment can be used in a broad range from infrared, red, green, blue, violet to ultraviolet, and can be practically used to light at a wavelength of 250 nm to 550 nm in which weatherability is insufficient in the conventional sealing material, leading to deterioration. Thereby, a white light emitting diode having a long life, high energy efficiency, and high color reproductivity can be obtained. Here, the wavelength of the light emission refers to a main peak wavelength of light emission.

Specific examples of the optical semiconductor light-emitting element to be used include light-emitting elements formed by laminating a semiconductor material on the substrate. In this case, examples of the semiconductor material include GaAs, GaP, GaAlAs, GaAsP, AlGaInP, GaN, InN, AlN, InGaAlN, and SiC.

Examples of the substrate include sapphire, spinel, SiC, Si, ZnO, and GaN single crystals. If necessary, a buffer layer may be formed between the substrate and the semiconductor material. Examples of these buffer layers include GaN and AlN.

A method of laminating the semiconductor material on the substrate is not particularly limited; for example, a MOCVD method, an HDVPE method, or a liquid phase growth method is used.

Examples of the structure of the light-emitting element include homo junction, hetero junction, and double hetero junction structures having MIS junction, PN junction, and PIN junction. Moreover, the structure can be a single- or multi-quantum well structure.

The light-emitting element can be sealed using the sealing material for an optical semiconductor composed of the curable resin composition of the present embodiment to produce an optical semiconductor light-emitting element (such as light emission diode). In this sealing, the optical semiconductor light-emitting element can be sealed only with the sealing material for an optical semiconductor, or can be sealed with this sealing material in combination with another sealing material. If another sealing material is used in combination, the optical semiconductor light-emitting element can be sealed with the sealing material for an optical semiconductor obtained by using the curable resin composition of the present embodiment, and then the surrounding region thereof can be sealed with another sealing material; alternatively, the optical semiconductor light-emitting element can be sealed with another sealing material, and then the surrounding region thereof can be sealed with the sealing material for a light-emitting element obtained by using the curable resin composition of the present embodiment. Examples of another sealing material include epoxy resins, silicone resins, acrylic resins, urea resins, imide resins, and glass.

FIG. 1 is a schematic sectional view of an optical semiconductor light-emitting element according to one embodiment. The optical semiconductor light-emitting element of FIG. 1 includes a housing 7 having lead electrodes 5 attached thereto, a die bonding material 2 for a light-emitting element electrically connected to one of the lead electrodes 5, a light-emitting element 1 deposited on the die bonding material 2 for a light-emitting element, a gold wire 4 electrically connected to the light-emitting element 1 and the other lead electrode 5, and a sealing material 3 for a light-emitting element sealing the light-emitting element 1, the die bonding material 2 for a light-emitting element, the gold wire 4, and the lead electrodes 5. Here, the sealing material 3 for a light-emitting element is composed of a cured product prepared by curing the curable resin composition of the present embodiment.

Figure 2:
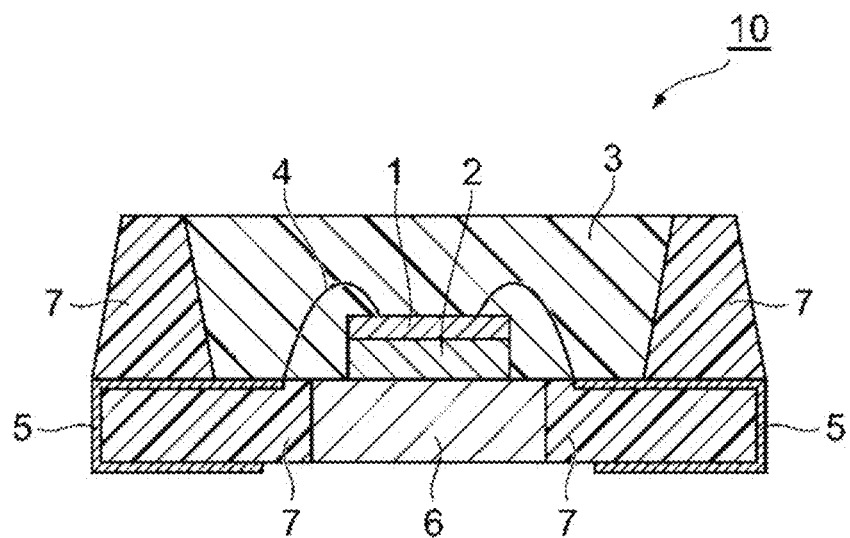
FIG. 2 is a schematic sectional view of an optical semiconductor light-emitting element according to other embodiment.

FIG. 2 is a schematic sectional view of an optical semiconductor light-emitting element according to another embodiment. The optical semiconductor light-emitting element of FIG. 2 includes a housing 7 having lead electrodes 5 attached thereto and a heat sink 6 in part of the housing, a gold wire 4 electrically connected to the lead electrode 5 and the light-emitting element 1, a die bonding material 2 for a light-emitting element disposed on the heat sink 6, a light-emitting element 1 deposited on the die bonding material 2 for a light-emitting element, and a sealing material 3 for a light-emitting element sealing the light-emitting element 1, the die bonding material 2 for a light-emitting element, the gold wire 4, and the lead electrodes 5. Here, the sealing material 3 for a light-emitting element is composed of a cured product prepared by curing the curable resin composition of the present embodiment.

Examples of the method of sealing an optical element with the sealing material for an optical semiconductor obtained by using the curable resin composition of the present embodiment include a method of preliminarily injecting a sealing material for a light-emitting element into a mold, immersing a lead frame or the like to which the light-emitting element is fixed, and then curing the sealing material; and a method of injecting a sealing material for a light-emitting element into a mold into which a light-emitting element is inserted, and curing the sealing material. At this time, examples of the method of injecting the sealing material for a light-emitting element include injection with a dispenser, transfer molding, and injection molding. Further examples of other sealing methods include a method of dropping a sealing material for a light-emitting element onto a light-emitting element to apply the sealing material by stencil printing, screen printing, or application through a mask, and curing the sealing material; and a method of injecting a sealing material for a light-emitting element into a cup or the like containing a light-emitting element on the bottom with a dispenser or the like, and curing the sealing material.

A curable composition containing the curable resin composition of the present embodiment can also be used as a die bonding material fixing a light-emitting element to a lead terminal or a package, a passivation film disposed on the light-emitting element, and a package substrate.

Examples of the shape of the sealed portion include forms of cannonball lenses, plates, and thin films.

The light emission diode obtained by using the curable resin composition of the present embodiment can improve the performance by a conventionally known method. Examples of the method of improving performance include a method of disposing a light reflecting layer or a light converging layer on the back surface of the light-emitting element; a method of forming a complementary color portion on the bottom; a method of disposing a layer absorbing light having a wavelength shorter than the main light emission peak on a light-emitting element; a method of sealing a light-emitting element, and then further molding the light-emitting element with a hard material; a method of inserting a light emission diode into a through hole to fix the light emission diode; and a method of connecting a light-emitting element to a lead member or the like by a flip chip connection or the like to extract light from the substrate direction.

The light emission diode obtained by using the curable resin composition of the present embodiment is useful as backlights for liquid crystal displays, lightings, sensors, printers, light sources for copiers, light sources for automobile indicates, signal lamps, display lamps, display devices, light sources for planar light emitting devices, displays, decorations, and lights, for example.

EXAMPLES

Hereinafter, by way of Examples, the present invention will be described more in detail, but the present invention will not be limited to these.

In the present Example, physical properties were measured by the following methods, respectively. The measurements were performed at room temperature, unless otherwise specified. Moreover, the term "parts" means "parts by mass".

(1) Epoxy Value

A resin sample was dissolved in benzyl alcohol and 1-propanol. After a potassium iodide aqueous solution and a bromophenol blue indicator were added to the solution, titration was performed with 1N hydrochloric acid; the point at which the reaction system turned from blue to yellow was defined as an equivalent point. From the equivalent point, the epoxy value of the resin was calculated according to the following equation:

Epoxy value (equivalent/100 g)=($V \times N \times F$)/(10×$W$)

W; weight (g) of the sample
V; amount of titration (ml)
N; normality (N) of hydrochloric acid used in titration
F; factor of hydrochloric acid used in titration
(2) Viscosity of Resin (Measuring Temperature: 25° C.)
The viscosity was measured using an E type viscometer at 25° C.
(3) Weight Average Molecular Weight
The weight average molecular weight was measured by GPC. As the columns, a TSKguard column HHR-H, a TSKgel G5000 HHR, TSKgel G3000 HHR, and a TSKgel G1000 HHR manufactured by Tosoh Corporation were connected in series for use, and the analysis was performed at a rate of 1 ml/min using chloroform as a mobile phase. As a detector, an RI detector was used, and the weight average molecular weight was determined using Easy Cal PS-2 (molecular weight distribution: 580 to 377400) polystyrene manufactured by Polymer Laboratories Ltd. and a styrene monomer (molecular weight: 104) as standard substances.
(4) Confirmation of Progress of Reaction
The progress of the reaction was confirmed by 1-H NMR as a chemical shift of SiH (4.7 ppm).
(5) Measurement of YI of Cured Product
The YI value was measured using CM-3600A manufactured by Konica Minolta, Inc. in a diffused illumination (integrating sphere, reception of light: 8° direction) mode using a light source composed of four pulsed xenon lamps equipped with a target mask LAV (diameter of the light: 25.2 mm), a white calibration plate CM-A139, and UV cut filters (400 nm cut filter and 420 nm cut filter). The data from the apparatus was processed using software SpectraMagic™ NX to obtain a value specified in YI D1925.
(6) Resistance to Yellowing by Heat
A flat plate of 40 mm×40 mm×3 mm was prepared, and was heated for 48 Hr or 144 Hr in an oven at 180° C., and then was measured for YI. The result indicates that as the YI value is smaller, the resistance to yellowing by heat is higher.
(7) Weatherability
A cured product having a thickness of 3 mm was set in a thermostat dryer kept at 50° C. so as to be irradiated with UV light through an optical fiber from an UV irradiation apparatus (manufactured by Ushio Inc.: SP-7). After the cured product was irradiated with light at 330 to 410 nm for 96 hours while the UV light was controlled at 4 W/cm$^2$ using a 365 nm band-pass filter, the YI of the spot irradiated was measured. The result indicates that as the numeric value of YI is lower, the weatherability is higher.
(8) Shore D (Hardness)
A flat plate of 40 mm×40 mm×3 mm was prepared, and was measured in a thermostat chamber at 25° C. with a durometer ASKER rubber durometer D type manufactured by ASKER Co. The center and the four corners of the flat plate were measured with the durometer pressed against these five places, and the average of the five points was taken. The result indicates that as the Shore D is higher, the hardness is higher.
(9) Index I of Crystallinity
(Method for Measurement by XRD Reflection Method)
A flat plate of 20 mm×20 mm×1 mm was prepared, and was measured with RIGAKU RINT2500V. Measurement was performed using incident X rays (wavelength: λ=1.5406 angstrom) and optical slits (diffusion-scattering-reception: 1 deg-0.05 mm-0.3 mm) at a scanning rate of 1°/min. From the results of this measurement, the index I of crystallinity represented by the following expression (8) was determined to evaluate the crystallinity of the cured product.

$$I=Ix/Iy \quad (8)$$

where Ix: the maximum value of the peak intensity at 2θ of 10 to 25° in the XRD analysis of the cured product,
Iy: the maximum value of the peak intensity at 2θ of 10 to 25° in the XRD analysis of polyethylene terephthalate
As polyethylene terephthalate for determining Iy, a card stand having a thickness of 1 mm manufactured by Kokuyo Co., Ltd (No. Kato-13N) was cut and used. Polyethylene terephthalate is a transparent crystalline cured product.
(10) Evaluation on Package
A curable resin composition was injected into a lead frame OP-5 for LED manufactured by ENOMOTO CO., LTD., was heated at 110° C. for 1 Hr, and then was cured under conditions of 160° C. for 3 Hr. Subsequently the curing state of the obtained cured product was checked.
A curable resin composition was injected into a lead frame 505010-8R (2 L) for LED manufactured by TTOP CORP.; a cured product was obtained on the same conditions as above, and the curing state was checked.
(11) Molar Amount of Active Hydrogen (H-Mol)
As the molar amount of active hydrogen in phenols, the structure was determined by H-NMR, and from the chemical formula, the value per amount used was determined. Moreover, for the compounds described in catalogs and technical data sheets, the values were used.
For active hydrogen of hydrosilanes, H-NMR was measured, the peak intensity of SiHMe$_2$-O—SiHMe$_2$ was compared to the peak intensity of the peak corresponding to Si—H (δ=near 4.6 ppm) to determine the amount of active hydrogen.

[Production Example 1] Production of Organopolysiloxane 1

Dioxane (400 parts), 1,3,5,7-tetramethylcyclotetrasiloxane (34 parts, SiH: 1 mol), and divinyltetramethyldisiloxane (16 parts, vinyl group: 0.3 mol), and 4-vinylcyclohexene oxide (50 parts, 0.7 mol) were placed in a four-necked flask equipped with a stirrer, a thermometer, and a reflux cooler, and were heated to 65° C., and a solution (1.2 parts) of 0.03% platinum catalyst in dioxane was then added. After addition of the catalyst, the reaction was performed for 18 hours to confirm by NMR that SiH disappeared. Subsequently, volatile components were distilled off to obtain Organopolysiloxane 1. The epoxy value of Organopolysiloxane 1 was 0.390 (equivalent/100 g), and the weight average molecular weight was 4500. The viscosity at 25° C. of the obtained Organopolysiloxane 1 was 12000 mPa·s. The raw materials used and the properties of the obtained organopolysiloxane are shown in Table 1.

[Production Example 2] Production of Organopolysiloxane 2

Dioxane (400 parts), 1,3,5,7-tetramethylcyclotetrasiloxane (35 parts, SiH: 1 mol), and divinyltetramethyldisiloxane (25 parts, vinyl group: 0.45 mol) and 4-vinylcyclohexene oxide (40 parts, 0.55 mol) were placed in a four-necked flask equipped with a stirrer, a thermometer, and a reflux cooler, and were heated to 65° C., and a solution (1.6 parts) of 0.03% platinum catalyst in dioxane was then added. After addition of the catalyst, the reaction was performed for 30 hours to confirm by NMR that SiH disappeared. Subsequently, volatile components were distilled off to obtain Organopolysiloxane 2. The epoxy value of Organopolysiloxane 2 was 0.322 (equivalent/100 g), and the weight average molecular weight was 7000. The viscosity at 25° C. of the obtained Organopolysiloxane 2 was 20000 mPa·s. The raw materials used and the properties of the obtained organopolysiloxane are shown in Table 1.

[Production Example 3] Production of Organopolysiloxane 3

Dioxane (400 parts), 1,3,5,7-tetramethylcyclotetrasiloxane (36 parts, SiH: 1 mol), and divinyltetramethyldisiloxane (34 parts, vinyl group: 0.6 mol), and 4-vinylcyclohexene oxide (30 parts, 0.4 mol) were placed in a four-necked flask equipped with a stirrer, a thermometer, and a reflux cooler, and were heated to 65° C., and a solution (1.7 parts) of 0.03% platinum catalyst in dioxane was then added. After addition of the catalyst, the reaction was performed for 48 hours to confirm by NMR that SiH disappeared. Subsequently, volatile components were distilled off to obtain Organopolysiloxane 3. The epoxy value of Organopolysiloxane 3 was 0.241 (equivalent/100 g), and the weight average molecular weight was 9000. The viscosity at 25° C. of the obtained Organopolysiloxane 3 was 50000 mPa·s. The raw materials used and the properties of the obtained organopolysiloxane are shown in Table 1.

TABLE 1

| | | Production Example 1 | Production Example 2 | Production Example 3 |
|---|---|---|---|---|
| Dioxane | Parts | 400 | 400 | 400 |
| 1,3,5,7-Tetramethyl-cyclotetrasiloxane | Parts | 34 | 35 | 36 |
| Divinyltetramethyl-disiloxane (molecular weight: 186) | Parts | 16 | 25 | 34 |
| 4-Vinylcyclohexene oxide | Parts | 50 | 40 | 30 |
| Solution of 0.03% platinum catalyst in dioxane | Parts | 1.2 | 1.6 | 1.7 |
| Epoxy value (equivalent/100 g) | Parts | 0.39 | 0.322 | 0.241 |
| Weight average molecular weight | Parts | 4500 | 7000 | 9000 |
| Viscosity (25° C.) | mPa · s | 12000 | 20000 | 50000 |

Example 1

IRGANOX 1076 (0.14 parts) and IRGANOX PS800FD (0.26 parts) were added to Organopolysiloxane 1 (100 parts), and were stirred until these were entirely uniform; the mixed solution was then defoamed, and was poured into a mold having a thickness of 3 mm. The mold was placed in an oven heated to 50° C.; after the temperature was raised to 150° C., the mold was heated for 2 Hr; further after the temperature was raised to 180° C., the mold was heated for 2 Hr. After heating at 180° C., the mold was spontaneously cooled to obtain a cured product. The performance of the obtained cured product is shown in Table 2.

Examples 2 to 13

Cured products were obtained in the same manner as in Example 1 using raw materials listed in Tables 2 to 4. The performances of the obtained cured products are shown in Tables 2 to 4.

[Comparative Example 1] Methylsilicone (KER-2500)

KER-2500B (100 parts) was added to KER-2500A (100 parts) manufactured by Shin-Etsu Chemical Co., Ltd., and these were stirred until these were entirely uniform; the mixed solution was then defoamed, and was poured into a mold having a thickness of 3 mm. The mold was placed in an oven heated to 100° C., and heated at 100° C. for 1 Hr; the temperature was raised to 150° C., and the mold was heated for 5 Hr. After heating at 150° C., the mold was spontaneously cooled to obtain a cured product. The performance of the obtained cured product is shown in Table 5. The hardness of the cured product was 20 in Shore D. Those having a Shore D of 30 or less were rubber-like, which are usually within a region for measurement in Shore A; however, these were measured in Shore D for comparison to Examples.

[Comparative Example 2] Modified Silicone (SCR1016)

SCR-1016B (100 parts) was added to SCR-1016A (100 parts) manufactured by Shin-Etsu Chemical Co., Ltd., and these were stirred until these were entirely uniform; the mixed solution was then defoamed, and was poured into a mold having a thickness of 3 mm. The mold was placed in an oven heated to 100° C., and heated at 100° C. for 1 Hr; the temperature was raised to 150° C., and the mold was heated for 5 Hr. After heating at 150° C., the mold was spontaneously cooled to obtain a cured product. The performance of the obtained cured product is shown in Table 5.

[Comparative Example 3] Phenylsilicone (OE6636)

OE6636B (200 parts) was added to OE6636A (100 parts) manufactured by Dow Corning Toray Co., Ltd., and these were stirred until these were entirely uniform; the mixed solution was then defoamed, and was poured into a mold having a thickness of 3 mm. The mold was placed in an oven heated to 150° C., and was heated for 1 Hr. After heating at 150° C., the mold was spontaneously cooled to obtain a cured product. The performance of the obtained cured product is shown in Table 5.

[Comparative Examples 4 to 6] Alicyclic Epoxy (CEL-2021P)

In the proportion shown in Table 3, 1,3,5,7-tetramethyl-cyclotetrasiloxane (2 parts) and IRGANOX 1076 (0.14 parts) or IRGANOX PS800FD (0.26 parts) were added to CEL-2021P (100 parts) manufactured by Daicel Corporation, and these were stirred until these were entirely uniform; the mixed solution was then defoamed, and was poured into a mold having a thickness of 3 mm. The mold was placed in an oven heated to 50° C.; the temperature was raised to 150°, and the mold was heated for 2 Hr; the temperature was further raised to 180° C., and the mold was heated for 2 Hr. After heating at 180° C., the mold was spontaneously cooled and tried to obtain a cured product; however, the product remained in liquid form and a cured product was not obtained.

[Comparative Example 7] Method 1 of Curing with Acid Anhydride and Evaluation on Physical Properties Propylene glycol (6 parts), MH-700G (73 parts, 1.2 mol equivalents based on epoxy groups of Organopolysiloxane 1), and U-CAT 18X (0.3 parts) were added to Organopolysiloxane 1 (100 parts), and these were stirred until these were entirely uniform; the mixed solution was then defoamed, and was poured into a mold having a thickness of 3 mm. The mold was placed in an oven heated to 50° C.; the temperature was raised to 120° C., and the mold was heated for 1 Hr; the temperature was raised to 150°, and the mold was heated for 1 Hr. After heating at 150° C., the mold was spontaneously cooled to obtain a cured product. The performance of the obtained cured product is shown in Table 5.

[Comparative Example 8] Method 2 of Curing with Acid Anhydride and Evaluation on Physical Properties Organopolysiloxane 3 (100 parts), MH (105 parts, 1 mol equivalent of epoxy groups of organopolysiloxane), U-CAT 18X (0.5 parts), KBM-303 (3.1 parts), and IRGANOX 1076 (0.14 parts), and IRGANOX PS800 FD (0.26 parts) were added to Organopolysiloxane 1 (100 parts), and these were stirred until these were entirely uniform; the mixed solution was then defoamed, and was poured into a mold having a thickness of 3 mm. The mold was placed in an oven heated to 50° C.; the temperature was raised to 100° C., and the mold was heated for 1 Hr; the temperature was raised to 160° C., and the mold was heated for 2 Hr; the temperature was further raised to 170° C., and the mold was heated for 1 Hr. After heating at 170° C., the mold was spontaneously cooled to obtain a cured product. The performance of the obtained cured product is shown in Table 5.

Figure 3:
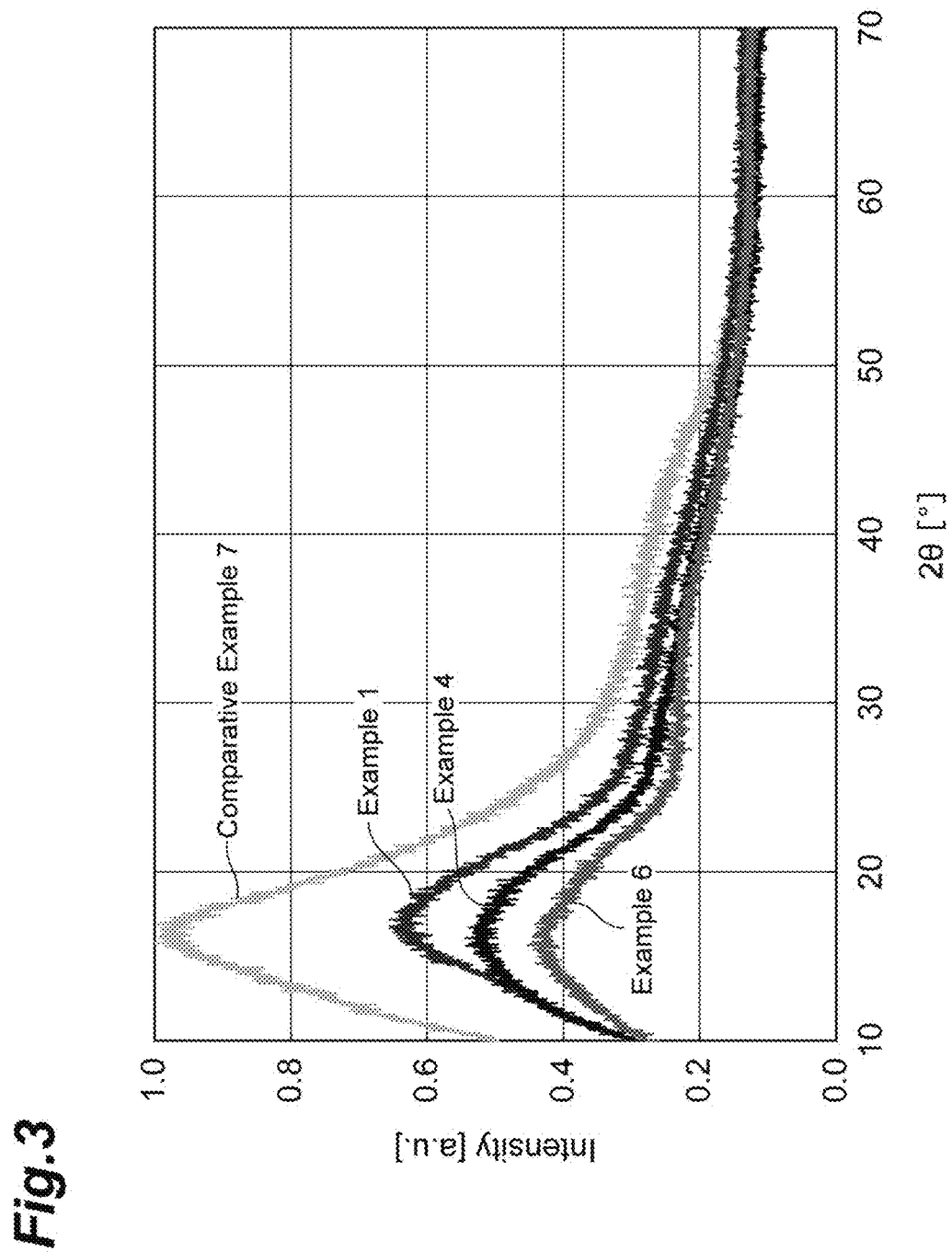
FIG. 3 is a diagram showing results in the XRD measurement of cured products obtained in Example 1, Example 4, Example 6, and Comparative Example 7.
Figure 4:
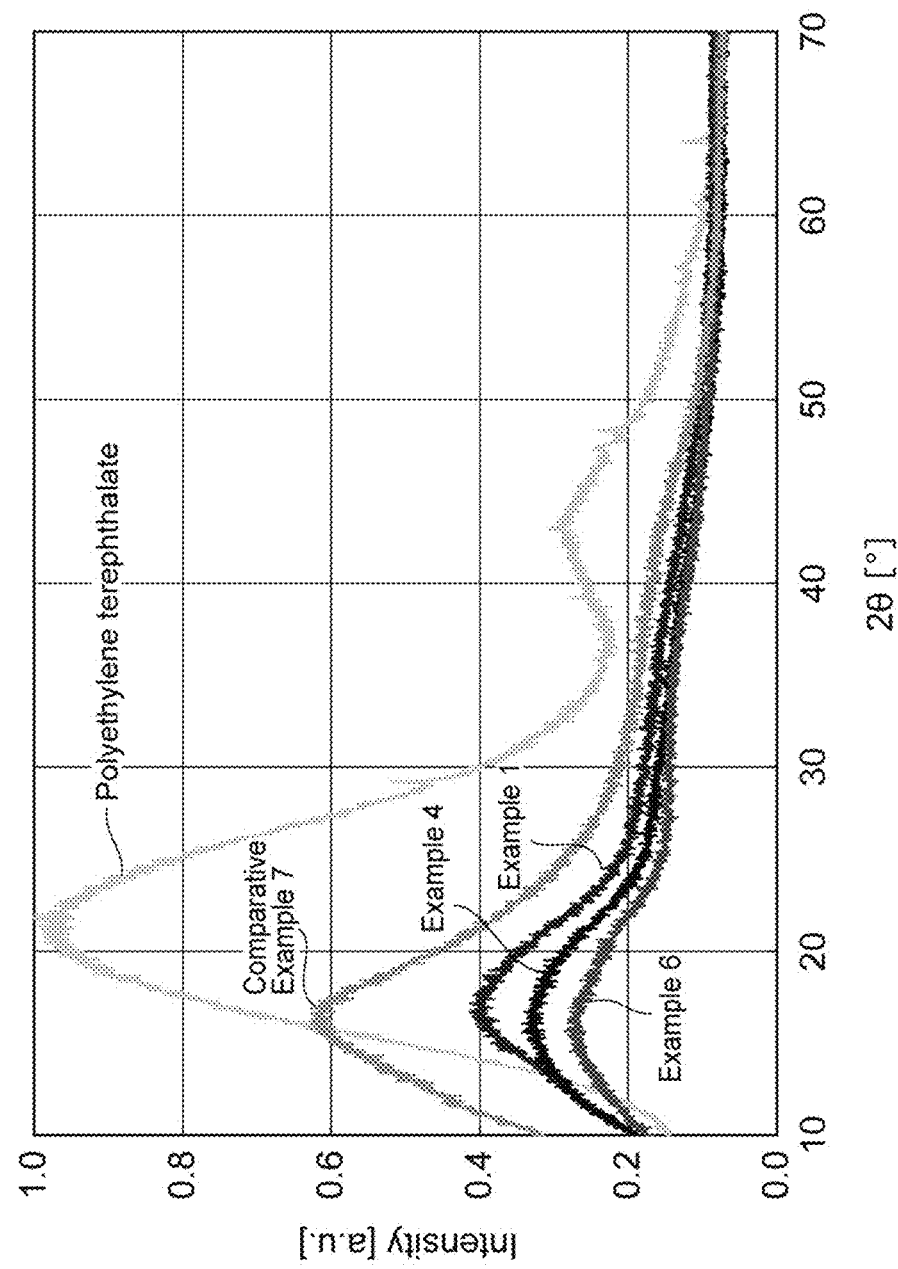
FIG. 4 is a diagram showing results in the XRD measurement of cured products obtained in Example 1, Example 4, Example 6, and Comparative Example 7 and polyethylene terephthalate.

The results in the XRD measurement of the cured products obtained in Example 1, Example 4, Example 6, and Comparative Example 7 are shown in FIG. 3. Moreover, the results in the XRD measurement of the cured products obtained in Example 1, Example 4, Example 6, and Comparative Example 7 and polyethylene terephthalate are shown in FIG. 4.

TABLE 2

|  |  |  | Ex. 1 | Ex. 2 | Ex. 3 | Ex. 4 | Ex. 5 |
|---|---|---|---|---|---|---|---|
| (A) Component | Organopolysiloxane 1 | Parts | 100 | — | — | 100 | — |
|  | Organopolysiloxane 2 | Parts | — | 100 | — | — | 100 |
|  | Organopolysiloxane 3 | Parts | — | — | 100 | — | — |
|  | Epoxy value (/100 g) | mmol | 390 | 322 | 241 | 390 | 322 |
|  | KER-2500A | Parts | — | — | — | — | — |
|  | KER-2500B | Parts | — | — | — | — | — |
|  | SCR-1016A | Parts | — | — | — | — | — |
|  | SCR-1016B | Parts | — | — | — | — | — |
|  | OE6636A | Parts | — | — | — | — | — |
|  | OE6636B | Parts | — | — | — | — | — |
|  | CEL-2021P | Parts | — | — | — | — | — |
|  | Propylene glycol | Parts | — | — | — | — | — |
|  | MH | Parts | — | — | — | — | — |
| (B)-1 Component | IRGANOX1076 | Parts | 0.14 | 0.14 | 0.14 | 0.14 | 0.14 |
|  | IRGANOX1010 | Parts | — | — | — | — | — |
| (B)-2 Component | 1,3,5,7-Tetramethylcyclotetrasiloxane | Parts | — | — | — | 2 | 2 |
|  | DSM-H03 (Hydrogen-terminated polydimethylsiloxane) | Parts | — | — | — | — | — |
|  | 3-Phenyl-1,1,3,5,5-pentamethyltrisiloxane | Parts | — | — | — | — | — |
|  | Active hydrogen molar amount (/amount used) | mmol | 0.264 | 0.264 | 0.264 | 33.524 | 33.524 |
|  | Epoxy value/active hydrogen molar amount (molar ratio) | — | 1477 | 1220 | 913 | 11.63 | 9.61 |
|  | Active hydrogen molar amount/epoxy value (molar ratio) | — | 0.0677 | 0.082 | 0.110 | 8.596 | 10.411 |
|  | IRGANOX PS800 FD | Parts | 0.26 | 0.26 | 0.26 | 0.26 | 0.26 |
|  | MH-700G | Parts | — | — | — | — | — |
|  | U-cat18X | Parts | — | — | — | — | — |
|  | KBM-303 | Parts | — | — | — | — | — |
| Results of evaluation | shore D | — | 35 | 35 | 35 | 55 | 55 |
|  | Resistance to yellowing by heat 180° C. | 0 Hr | 1 | 1 | 1 | 1 | 1 |
|  |  | 48 Hr | 3 | 3 | 3 | 3 | 3 |
|  | Weatherability 4 W/cm$^2$ | 0 Hr | 1 | 1 | 1 | 1 | 1 |
|  |  | 96 Hr | 2 | 2 | 2 | 2 | 2 |

TABLE 3

|  |  |  | Ex. 6 | Ex. 7 | Ex. 8 | Ex. 9 | Ex. 10 |
|---|---|---|---|---|---|---|---|
| (A) Component | Organopolysiloxane 1 | Parts | — | 100 | — | — | 100 |
|  | Organopolysiloxane 2 | Parts | — | — | 100 | — | — |
|  | Organopolysiloxane 3 | Parts | 100 | — | — | 100 | — |
|  | Epoxy value (/100 g) | mmol | 241 | 390 | 322 | 241 | 390 |
|  | KER-2500A | Parts | — | — | — | — | — |
|  | KER-2500B | Parts | — | — | — | — | — |
|  | SCR-1016A | Parts | — | — | — | — | — |
|  | SCR-1016B | Parts | — | — | — | — | — |
|  | OE6636A | Parts | — | — | — | — | — |
|  | OE6636B | Parts | — | — | — | — | — |

TABLE 3-continued

|  |  |  | Ex. 6 | Ex. 7 | Ex. 8 | Ex. 9 | Ex. 10 |
|---|---|---|---|---|---|---|---|
|  | CEL-2021P | Parts | — | — | — | — | — |
|  | Propylene glycol | Parts | — | — | — | — | — |
|  | MH | Parts | — | — | — | — | — |
| (B)-1 Component | IRGANOX1076 | Parts | 0.14 | 0.14 | 0.14 | 0.14 | 0.07 |
|  | IRGANOX1010 | Parts | — | — | — | — | — |
| (B)-2 Component | 1,3,5,7-Tetramethylcyclo-tetrasiloxane | Parts | 2 | — | — | — | — |
|  | DSM-H03 (Hydrogen-terminated polydimethylsiloxane) | Parts | — | — | — | — | — |
|  | 3-Phenyl-1,1,3,5,5-pentamethyltrisiloxane | Parts | — | 6.5 | 6.5 | 6.5 | — |
|  | Active hydrogen molar amount (/amount used) | mmol | 33.524 | 51.224 | 51.224 | 51.224 | 0.132 |
|  | Epoxy value/active hydrogen molar amount (molar ratio) | — | 7.19 | 7.61 | 6.29 | 4.70 | 2955 |
|  | Active hydrogen molar amount/epoxy value (molar ratio) | — | 13.910 | 13.134 | 15.908 | 21.255 | 0.034 |
|  | IRGANOX PS800 FD | Parts | 0.26 | 0.26 | 0.26 | 0.26 | 0.13 |
|  | MH-700G | Parts | — | — | — | — | — |
|  | U-cat18X | Parts | — | — | — | — | — |
|  | KBM-303 | Parts | — | — | — | — | — |
| Results of evaluation | shore D | — | 50 | 35 | 35 | 35 | 40 |
|  | Resistance to yellowing by heat 180° C. | 0 Hr | 1 | 1 | 1 | 1 | 1 |
|  |  | 48 Hr | 3 | 3 | 1 | 3 | 5 |
|  | Weatherability 4 W/cm² | 0 Hr | 1 | 1 | 1 | 1 | 1 |
|  |  | 96 Hr | 2 | 3 | 3 | 3 | 4 |

TABLE 4

|  |  |  | Ex. 11 | Ex. 12 | Ex. 13 | Ex. 14 | Ex. 15 |
|---|---|---|---|---|---|---|---|
| (A) Component | Organopolysiloxane 1 | Parts | 100 | 100 | 100 | 100 | 100 |
|  | Organopolysiloxane 2 | Parts | — | — | — | — | — |
|  | Organopolysiloxane 3 | Parts | — | — | — | — | — |
|  | Epoxy value (/100 g) | mmol | 390 | 390 | 390 | 390 | 390 |
|  | KER-2500A | Parts | — | — | — | — | — |
|  | KER-2500B | Parts | — | — | — | — | — |
|  | SCR-1016A | Parts | — | — | — | — | — |
|  | SCR-1016B | Parts | — | — | — | — | — |
|  | OE6636A | Parts | — | — | — | — | — |
|  | OE6636B | Parts | — | — | — | — | — |
|  | CEL-2021P | Parts | — | — | — | — | — |
|  | Propylene glycol | Parts | — | — | — | — | — |
|  | MH | Parts | — | — | — | — | — |
| (B)-1 Component | IRGANOX1076 | Parts | 0.4 | — | 0.14 | — | 0.14 |
|  | IRGANOX1010 | Parts | — | 0.3 | — | — | — |
| (B)-2 Component | 1,3,5,7-Tetramethylcyclo-tetrasiloxane | Parts | — | — | — | 2 | — |
|  | DSM-H03 (Hydrogen-terminated polydimethylsiloxane) | Parts | — | — | 5 | — | — |
|  | 3-Phenyl-1,1,3,5,5-pentamethyltrisiloxane | Parts | — | — | — | — | — |
|  | Active hydrogen molar amount (/amount used) | mmol | 0.753 | 1.01 | 22.484 | 33.26 | 0.264 |
|  | Epoxy value/active hydrogen molar amount (molar ratio) | — | 518 | 386 | 17.35 | 11.73 | 1477 |
|  | Active hydrogen molar amount/epoxy value (molar ratio) | — | 0.193 | 0.259 | 5.765 | 8.528 | 0.068 |
|  | IRGANOX PS800 FD | Parts | 0.26 | 0.26 | 0.26 | — | — |
|  | MH-700G | Parts | — | — | — | — | — |
|  | U-cat18X | Parts | — | — | — | — | — |
|  | KBM-303 | Parts | — | — | — | — | — |
| Results of evaluation | shore D | — | 35 | 35 | 45 | 55 | 35 |
|  | Resistance to yellowing by heat 180° C. | 0 Hr | 1 | 1 | 1 | 1 | 1 |
|  |  | 48 Hr | 3 | 3 | 3 | 8 | 5 |
|  | Weatherability 4 W/cm² | 0 Hr | 1 | 1 | 1 | 1 | 1 |
|  |  | 96 Hr | 3 | 3 | 2 | 5 | 4 |

TABLE 5

|  |  |  | Comp. Ex. 1 | Comp. Ex. 2 | Comp. Ex. 3 | Comp. Ex. 4 |
|---|---|---|---|---|---|---|
| (A) Component | Organopolysiloxane 1 | Parts | — | — | — | — |
|  | Organopolysiloxane 2 | Parts | — | — | — | — |
|  | Organopolysiloxane 3 | Parts | — | — | — | — |
|  | Epoxy value (/100 g) | mmol | — | — | — | 793 |
|  | KER-2500A | Parts | 100 | — | — | — |
|  | KER-2500B | Parts | 100 | — | — | — |
|  | SCR-1016A | Parts | — | 100 | — | — |
|  | SCR-1016B | Parts | — | 100 | — | — |
|  | OE6636A | Parts | — | — | 100 | — |
|  | OE6636B | Parts | — | — | 200 | — |
|  | CEL-2021P | Parts | — | — | — | 100 |
|  | Propylene glycol | Parts | — | — | — | — |
|  | MH | Parts | — | — | — | — |
| (B)-1 Component | IRGANOX1076 | Parts | — | — | — | 0.14 |
|  | IRGANOX1010 | Parts | — | — | — | — |
| (B)-2 Component | 1,3,5,7-Tetramethylcyclo-tetrasiloxane | Parts | — | — | — | — |
|  | DSM-H03 (Hydrogen-terminated polydimethylsiloxane) | Parts | — | — | — | — |
|  | 3-Phenyl-1,1,3,5,5-pentamethyltrisiloxane | Parts | — | — | — | — |
|  | Active hydrogen molar amount (/amount used) | mmol | — | — | — | 0.264 |
|  | Epoxy value/active hydrogen molar amount (molar ratio) | — | — | — | — | 3004 |
|  | Active hydrogen molar amount/epoxy value (molar ratio) | — | — | — | — | 0.033 |
|  | IRGANOX PS800 FD | Parts | — | — | — | 0.26 |
|  | MH-700G | Parts | — | — | — | — |
|  | U-cat18X | Parts | — | — | — | — |
|  | KBM-303 | Parts | — | — | — | — |
| Results of evaluation | shore D | — | 20 | 25 | 25 | — |
|  | Resistance to yellowing by heat 180° C. | 0 Hr | 1 | 3 | 1 | — |
|  |  | 48 Hr | 3 | 13 | 3 | — |
|  | Weatherability 4 W/cm$^2$ | 0 Hr | 1 | 3 | 1 | — |
|  |  | 96 Hr | 1 | 40 | 3 | — |

|  |  |  | Comp. Ex. 5 | Comp. Ex. 6 | Comp. Ex. 7 | Comp. Ex. 8 |
|---|---|---|---|---|---|---|
| (A) Component | Organopolysiloxane 1 | Parts | — | — | 100 | 50 |
|  | Organopolysiloxane 2 | Parts | — | — | — | — |
|  | Organopolysiloxane 3 | Parts | — | — | — | 50 |
|  | Epoxy value (/100 g) | mmol | 793 | 793 | 390 | 316 |
|  | KER-2500A | Parts | — | — | — | — |
|  | KER-2500B | Parts | — | — | — | — |
|  | SCR-1016A | Parts | — | — | — | — |
|  | SCR-1016B | Parts | — | — | — | — |
|  | OE6636A | Parts | — | — | — | — |
|  | OE6636B | Parts | — | — | — | — |
|  | CEL-2021P | Parts | 100 | 100 | — | — |
|  | Propylene glycol | Parts | — | — | 6 | — |
|  | MH | Parts | — | — | — | 53 |
| (B)-1 Component | IRGANOX1076 | Parts | 0.28 | 0.14 | — | — |
|  | IRGANOX1010 | Parts | — | — | — | — |
| (B)-2 Component | 1,3,5,7-Tetramethylcyclo-tetrasiloxane | Parts | — | 2 | — | — |
|  | DSM-H03 (Hydrogen-terminated polydimethylsiloxane) | Parts | — | — | — | — |
|  | 3-Phenyl-1,1,3,5,5-pentamethyltrisiloxane | Parts | — | — | — | — |
|  | Active hydrogen molar amount (/amount used) | mmol | 0.528 | 33.524 | — | 0.264 |
|  | Epoxy value/active hydrogen molar amount (molar ratio) | — | 1502 | 23.65 | — | 1197 |
|  | Active hydrogen molar amount/epoxy value (molar ratio) | — | 0.067 | 4.227 | — | 0.084 |
|  | IRGANOX PS800 FD | Parts | 0.52 | 0.26 | — | 0.26 |
|  | MH-700G | Parts | — | — | 73 | — |
|  | U-cat18X | Parts | — | — | 0.3 | 0.5 |
|  | KBM-303 | Parts | — | — | — | 3.1 |
| Results of evaluation | shore D | — | — | — | 70 | 70 |
|  | Resistance to yellowing by heat 180° C. | 0 Hr | — | — | 2 | 1 |
|  |  | 48 Hr | — | — | 11 | 17 |
|  | Weatherability 4 W/cm$^2$ | 0 Hr | — | — | 1 | 1 |
|  |  | 96 Hr | — | — | 2 | 2 |

Examples A1 to A11

Figure 5:
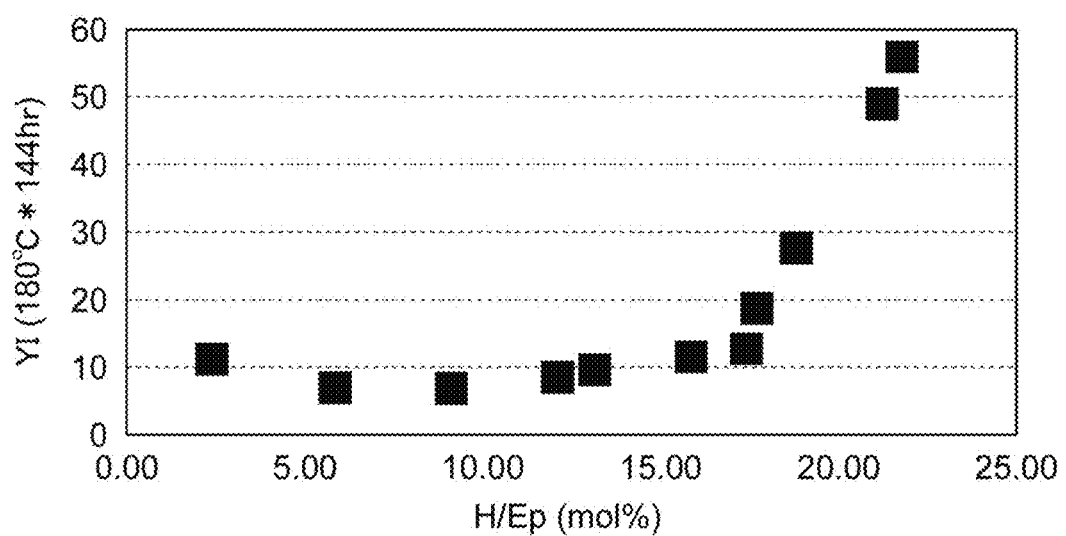
FIG. 5 is a diagram showing a relation between the H/Ep ratio and resistance to yellowing by heat.

The raw materials listed in Table 6 were stirred until these were entirely uniform; and the mixed solution was then defoamed, and was poured into a mold having a thickness of 1 mm. The mold was placed in an oven heated to 50° C.; the temperature was raised to 110° C., and the mold was then heated for 1 Hr; the temperature was further raised to 160° C., and the mold was then heated for 3 Hr. After heating at 160° C., the mold was spontaneously cooled to obtain a cured product. The performance of the obtained cured product is shown in Table 6 and the relation between the ratio H/Ep and resistance to yellowing by heat is shown in FIG. 5.

Moreover, the resistance to yellowing by heat of the composition in Comparative Example 7 was evaluated; the composition turned dark brown at 180° C. after 96 hours passed.

Figure 6:
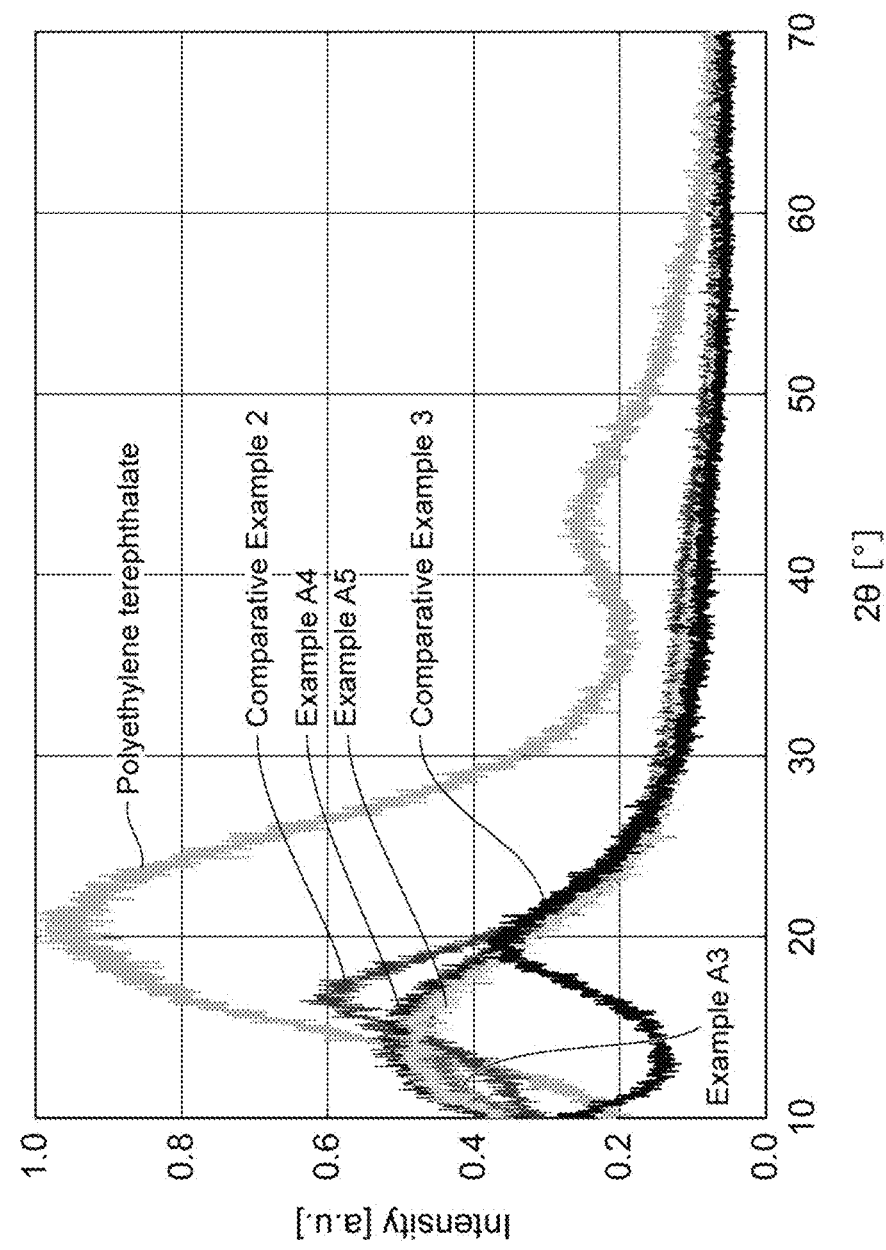
FIG. 6 is a diagram showing results in the XRD measurement of cured products obtained in Example A3, Example A4, Example A5, Comparative Example 2, and Comparative Example 3 and polyethylene terephthalate.

Moreover, the nominalized XRD data of the cured products obtained in Examples A3, A4, A5, and Comparative Examples 2 and 3 based on polyethylene terephthalate are shown in FIG. 6.

TABLE 6

| | | | Ex. A1 | Ex. A2 | Ex. A3 | Ex. A4 | Ex. A5 | Ex. A6 |
|---|---|---|---|---|---|---|---|---|
| (A) Component | Organopolysiloxane 1 | Parts | 100 | 100 | 100 | 100 | 100 | 100 |
| | Organopolysiloxane 2 | Parts | — | — | — | — | — | — |
| | Organopolysiloxane 3 | Parts | — | — | — | — | — | — |
| | EP-mol (/100 g) | mmol | 390 | 390 | 390 | 390 | 390 | 390 |
| (B)-1 Component | IRGANOX1076 (531 g/mol: Monofunctional) | Parts | — | — | — | — | — | — |
| | IRGANOX1010 (1178 g/mol: Tetrafunctional) | Parts | — | — | — | — | — | — |
| | IRGANOX1035 (643 g/mol: Bifunctional) | Parts | 0.45 | 0.45 | 0.45 | 0.45 | 0.45 | 0.45 |
| | H-mol (/amount used) | mmol | 1.4 | 1.4 | 1.4 | 1.4 | 1.4 | 1.4 |
| (B)-2 Component | 1,3,5,7-Tetramethylcyclo-tetrasiloxane | Parts | 3 | 4 | 3 | 4.5 | 4.5 | 6 |
| | DSM-H03 (Hydrogen-terminated polydimethylsiloxane) | Parts | — | — | 4 | 4.5 | 4.5 | 3 |
| | 3-Phenyl-1,1,3,5,5-pentamethyltrisiloxane | Parts | — | — | — | — | — | — |
| | H-mol (/amount used) | mmol | 49.9 | 66.6 | 67.7 | 94.9 | 94.9 | 113.2 |
| | TOTAL H-mol (/amount used)*1 | — | 51.3 | 68.0 | 69.1 | 82.8 | 73.4 | 85.0 |
| | EP/H (molar ratio) | — | — | 7.6 | 5.7 | 5.6 | 4.7 | 5.3 | 4.6 |
| | H/EP (mol %) | % | 13.16 | 17.42 | 17.72 | 21.23 | 18.83 | 21.79 |
| | KBM-303 | Parts | — | — | — | — | — | — |
| | KBM-1003 | Parts | — | — | — | 2 | 3 | 4 |
| | DSM-V05 (Vinyl-terminated polydimethylsiloxane) | Parts | — | — | — | — | 1 | 1 |
| | Karsteadt Catalyst | ppm | 4 | 4 | 4 | 4 | 4 | 4 |
| Results of evaluation | Shore D | — | 45 | 50 | 45 | 50 | 50 | 55 |
| | Resistance to yellowing by heat 180° C. | 144 h | 9.5 | 12.7 | 18.7 | 48.9 | 27.6 | 55.9 |

| | | | Ex. A7 | Ex. A8 | Ex. A9 | Ex. A10 | Ex. A11 |
|---|---|---|---|---|---|---|---|
| (A) Component | Organopolysiloxane 1 | Parts | 100 | 100 | 100 | 100 | 100 |
| | Organopolysiloxane 2 | Parts | — | — | — | — | — |
| | Organopolysiloxane 3 | Parts | — | — | — | — | — |
| | EP-mol (/100 g) | mmol | 390 | 390 | 390 | 390 | 390 |
| (B)-1 Component | IRGANOX1076 (531 g/mol: Monofunctional) | Parts | — | — | — | — | — |
| | IRGANOX1010 (1178 g/mol: Tetrafunctional) | Parts | — | — | — | — | — |
| | IRGANOX1035 (643 g/mol: Bifunctional) | Parts | 0.45 | 0.45 | 0.45 | 0.45 | 0.45 |
| | H-mol (/amount used) | mmol | 1.4 | 1.4 | 1.4 | 1.4 | 1.4 |
| (B)-2 Component | 1,3,5,7-Tetramethylcyclo-tetrasiloxane | Parts | 4 | 2 | 3 | 2 | 2.5 |
| | DSM-H03 (Hydrogen-terminated polydimethylsiloxane) | Parts | 2 | 4 | 6 | 4 | 5 |
| | 3-Phenyl-1,1,3,5,5-pentamethyltrisiloxane | Parts | — | — | — | — | — |
| | H-mol (/amount used) | mmol | 75.4 | 51.1 | 76.6 | 51.1 | 63.8 |
| | TOTAL H-mol (/amount used)*1 | — | 47.3 | 9.4 | 61.9 | 22.9 | 35.6 |
| | EP/H (molar ratio) | — | 8.3 | 41.6 | 6.3 | 17.1 | 10.9 |
| | H/EP (mol %) | % | 12.12 | 2.40 | 15.87 | 5.86 | 9.14 |
| | KBM-303 | Parts | — | — | — | — | — |
| | KBM-1003 | Parts | 4 | 6 | 2 | 4 | 4 |
| | DSM-V05 (Vinyl-terminated polydimethylsiloxane) | Parts | 1 | 1 | 1 | 1 | 1 |
| | Karsteadt Catalyst | ppm | 4 | 4 | 4 | 4 | 4 |

TABLE 6-continued

| Results of evaluation | Shore D | — | 50 | 40 | 45 | 40 | 45 |
|---|---|---|---|---|---|---|---|
| | Resistance to yellowing by heat 180° C. | 144 h | 8.4 | 11.1 | 11.5 | 6.9 | 6.8 |

*1: Si—H has a high reactivity with a vinyl group, and therefore TOTAL H-mol is a value obtained by subtracting vinyl groups in KBM-1003 and DSM-V05.

Examples B1 and B2, Comparative Examples B1 and B2

Figure 7:
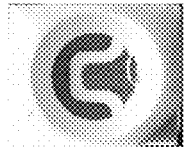
FIG. 7 is a diagram showing evaluation on package cured products obtained in Example B1, Example B2, Comparative Example B1, and Comparative Example B2.
Figure 7:
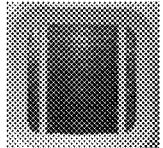
Figure 7:
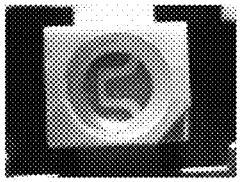
Figure 7:
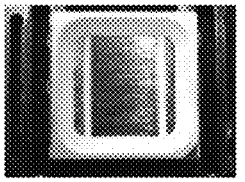
Figure 7:
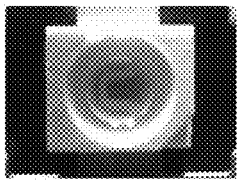
Figure 7:
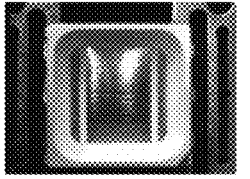
Figure 7:
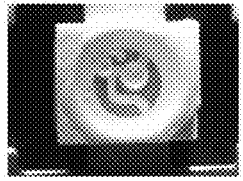
Figure 7:
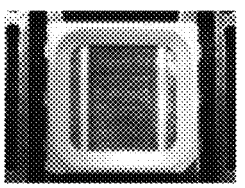

The raw materials listed in Table 7 were stirred until these were entirely uniform; and the mixed solution was then defoamed, and was poured into two packages. The packages were placed in an oven heated to 50° C.; the temperature was raised to 110° C., and the packages were then heated for 1 Hr; the temperature was further raised to 160° C., and the packages were then heated for 3 Hr. After heating at 160° C., the packages were spontaneously cooled to obtain packaged cured products. The states of obtained packages are shown in FIG. 7. The cured products were obtained in Examples B1 and B2 whereas curing did not sufficiently progress in Comparative Examples B1 and B2.

TABLE 7

| | | | Ex. B1 | Ex. B2 | Comp. Ex. B1 | Comp. Ex. B2 |
|---|---|---|---|---|---|---|
| (A) Component | Organopolysiloxane 1 | Parts | 100 | — | — | — |
| | AER250 | Parts | — | 100 | — | — |
| | CELLOXIDE 2021P (bifunctional alicyclic epoxy) | Parts | — | — | 100 | — |
| | X22-169AS (Epoxy-terminated siloxane) | Parts | — | — | — | 100 |
| | EP-mol (/100 g) | mmol | 390 | 541 | 746 | 200 |
| (B)-1 Component | IRGANOX1035 | Parts | 0.45 | 0.45 | 0.45 | 0.45 |
| (B)-1 Component | 1,3,5,7-Tetramethylcyclo-tetrasiloxane | Parts | 4 | 4 | 4 | 2 |
| | Karsteadt Catalyst | ppm | 5 | 5 | 5 | 5 |
| | H-mol (/amount used) | mmol | 66.6 | 66.6 | 66.6 | 33.3 |
| | EP/H (molar ratio) | — | 5.9 | 8.1 | 11.2 | 6.0 |
| | H/EP (mol %) | % | 17.07 | 12.30 | 8.92 | 16.64 |

REFERENCE SIGNS LIST

1 . . . light-emitting element, 2 . . . die bonding material for optical semiconductor, 3 . . . sealing material for optical semiconductor, 4 . . . gold wire, 5 . . . lead electrode, 6 . . . heat sink, 7 . . . housing, 10 . . . optical semiconductor light-emitting element (optical semiconductor element).

The invention claimed is:

1. A curable resin composition, comprising
(A) an epoxy compound having three or more epoxy groups in one molecule, the epoxy compound comprising an organopolysiloxane containing a compound represented by the following formula (1) or a compound represented by the following formula (2):

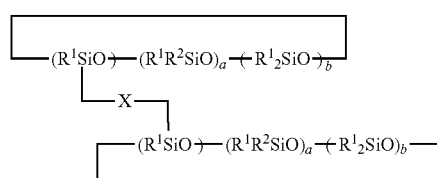

(1)

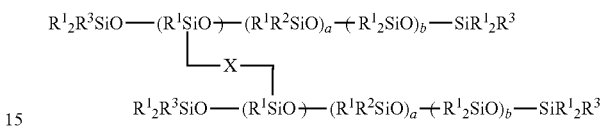

(2)

in which $R^1$ each independently represents a substituted or unsubstituted monovalent hydrocarbon group having a carbon number of 1 to 10; $R^2$ each independently represents an epoxy group-containing organic group; $R^3$ each independently represents $R^1$ or $R^2$; a each independently represents an integer of 2 or more; b each independently represents an integer of 0 or more; and X represents a group represented by the following formula (3):

$$-Y-Z-Y-  \quad (3)$$

where Y each independently represents an —O— bond or a divalent hydrocarbon group having a carbon number of 1 to 6; and Z represents a group represented by the following formula (4):

$$-(R^4{}_2SiO)_c-(R^4{}_nQ_{2-n}SiO)_d-SiR^4{}_2- \quad (4)$$

where $R^4$ each independently represents a substituted or unsubstituted monovalent hydrocarbon group having a carbon number of 1 to 10: c represents an integer of 0 or more: d represents an integer of 0 or more: n represents 0 or 1; and Q represents a group represented by the following formula (5):

$$-P_0-P_1 \quad (5)$$

where $P_0$ represents any of an —O— bond, a divalent hydrocarbon group having a carbon number of 1 to 10 and optionally having ether bond, or ester bond, and a substituted or unsubstituted dimethylsiloxy group; and $P_1$ represents any of a methyl group, a trimethylsilyl group, and a group represented by the following formula (6) or the following formula (7):

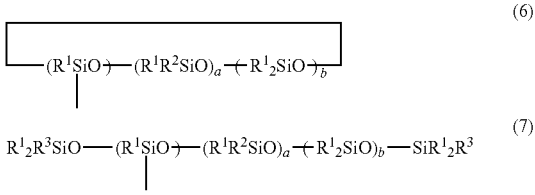

where $R^1$, $R^2$, $R^3$, a, and b are the same as $R^1$, $R^2$, $R^3$, a, and b in the formula (1) and the formula (2);

(B-1) an optional active hydrogen compound selected from the group consisting of phenols having at least one phenol group in one molecule; and (B-2) an active hydrogen compound selected from the group consisting of monosilanes having at least one hydrosilyl group in one molecule and polysiloxanes having at least one hydrosilyl group in one molecule.

2. The curable resin composition according to claim 1, further comprising an epoxy silicone containing at least (C) a compound represented by the following formula (8) and a compound represented by the following formula (9), the epoxy silicone being represented by an average composition formula (10) where the value of $[u/(o+p+q+r+s+t+u+x+y+z)]$ is in the range of 0.020 or less:

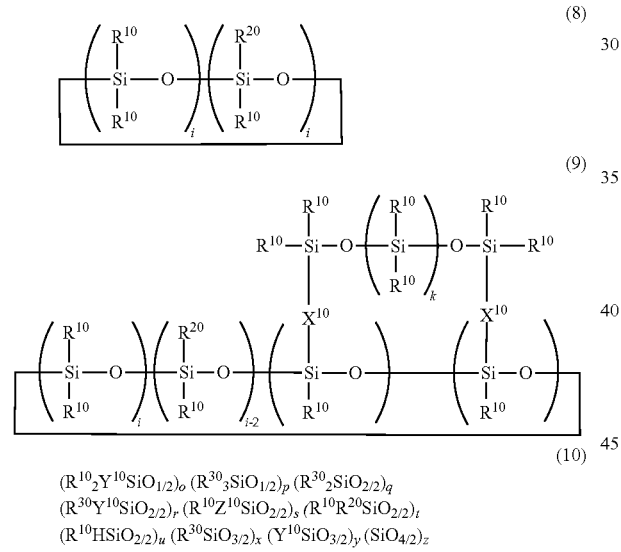

in which $R^{10}$ each independently represents at least one or more organic groups selected from the group consisting of: A) monovalent aliphatic organic groups having a carbon number of 1 or more and 24 or less and an oxygen number of 0 or more and 5 or less and having aliphatic hydrocarbon units composed of one or more structures selected from the group consisting of unsubstituted or substituted linear, branched, and cyclic structures; B) monovalent aromatic organic groups having a carbon number of 6 or more and 24 or less and an oxygen number of 0 or more and 5 or less and having unsubstituted or substituted aromatic hydrocarbon units optionally having aliphatic hydrocarbon units composed of one or more structures selected from the group consisting of unsubstituted or substituted linear, branched, and cyclic structures; and C) monovalent organic groups having a carbon number of 5 or more and 26 or less, an oxygen number of 0 or more and 5 or less, and one silicon atom and having aliphatic and/or aromatic hydrocarbon units composed of one or more structures selected from the group consisting of unsubstituted or substituted linear, branched and cyclic structures;

$R^{20}$ each independently represents D) an organic group having an epoxy group having a carbon number of 4 or more and 24 or less and an oxygen number of 1 or more and 5 or less and having aliphatic hydrocarbon units composed of one or more structures selected from the group consisting of unsubstituted or substituted linear, branched, and cyclic structures;

$R^{30}$ each independently represents at least one or more organic groups selected from the group consisting of: A) monovalent aliphatic organic groups having a carbon number of 1 or more and 24 or less and an oxygen number of 0 or more and 5 or less and having aliphatic hydrocarbon units composed of one or more structures selected from the group consisting of unsubstituted or substituted linear, branched, and cyclic structures; B) monovalent aromatic organic groups having a carbon number of 6 or more and 24 or less and an oxygen number of 0 or more and 5 or less and having unsubstituted or substituted aromatic hydrocarbon units optionally having aliphatic hydrocarbon units composed of one or more structures selected from the group consisting of unsubstituted or substituted linear, branched, and cyclic structures; C) monovalent organic groups having a carbon number of 5 or more and 26 or less, an oxygen number of 0 or more and 5 or less, and one silicon atom and having aliphatic and/or aromatic hydrocarbon units composed of one or more structures selected from the group consisting of unsubstituted or substituted linear, branched and cyclic structures; and E) monovalent aliphatic organic groups composed of one or more structures selected from the group consisting of unsubstituted or substituted linear and branched structures having a carbon number of 2 or more and 6 or less and including a carbon-carbon double bond;

$X^{10}$ represents a divalent hydrocarbon group composed of one or more structures selected from the group consisting of unsubstituted or substituted linear and branched structures having a carbon number of 2 or more and 6 or less;

$Y^{10}$ each independently represents a divalent hydrocarbon group composed of one or more structures selected from the group consisting of unsubstituted or substituted linear and branched structures having a carbon number of 2 or more and 6 or less;

$Z^{10}$ represents a bond to the divalent hydrocarbon group $Y^{10}$;

i each independently represents an integer of 0 or more; j each independently represents an integer of 3 or more; k represents an integer of 0 or more; o, p, q, r, s, t, u, x, y, and z represent the numbers of moles of the respective structural units present in 1 mol of epoxy silicone; o, s, and t are values of more than 0; p, q, r, u, x, y, and z each are a value of 0 or more and satisfying s=o+r+y; in the formula (8) and the formula (9), the chain may be random or block.

3. The curable resin composition according to claim 1, wherein (B-1) is present in the composition.

4. The curable resin composition according to claim 1, wherein at least one of (B-1) and (B-2) present in the composition contains three or more active hydrogen atoms in one molecule.

5. The curable resin composition according to claim 1, wherein the molar amount of active hydrogen in a total of (B-1) and (B-2) is 0.01 to 30 mol % based on the molar amount of epoxy groups present in the composition.

6. The curable resin composition according to claim 1, wherein in the formula (4), d is 0.

7. The curable resin composition according to claim 1, further comprising a platinum compound.

8. The curable resin composition according to claim 1, further comprising a heat stabilizer.

9. A method of producing a cured product, comprising the step of curing the curable resin composition according to claim 1 at a temperature of 50 to 250° C.

10. A cured product prepared by curing the curable resin composition according to claim 1.

11. A sealing material for an optical semiconductor comprising the cured product according to claim 10.

12. An optical semiconductor light-emitting element comprising the sealing material for an optical semiconductor according to claim 11.

13. A die bonding material for an optical semiconductor comprising the cured product according to claim 10.

14. An optical semiconductor light-emitting element comprising the die bonding material for an optical semiconductor according to claim 13.

* * * * *